(12) United States Patent
Chen et al.

(10) Patent No.: US 10,763,270 B2
(45) Date of Patent: Sep. 1, 2020

(54) METHOD FOR FORMING AN INTEGRATED CIRCUIT AND AN INTEGRATED CIRCUIT

(71) Applicant: Taiwan Semiconductor Manufacturing Co., Ltd., Hsin-Chu (TW)

(72) Inventors: Tzu-Yu Chen, Kaohsiung (TW); Kuo-Chi Tu, Hsin-Chu (TW); Wen-Ting Chu, Kaohsiung (TW); Yong-Shiuan Tsair, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 6 days.

(21) Appl. No.: 15/964,702

(22) Filed: Apr. 27, 2018

(65) Prior Publication Data
US 2019/0333920 A1 Oct. 31, 2019

(51) Int. Cl.
*H01L 27/11507* (2017.01)
*H01L 27/11509* (2017.01)
(Continued)

(52) U.S. Cl.
CPC ... *H01L 27/11507* (2013.01); *H01L 21/31111* (2013.01); *H01L 21/31144* (2013.01);
(Continued)

(58) Field of Classification Search
CPC .......... H01L 2924/1437; H01L 27/115–11597; H01L 27/11548; H01L 27/11512;
(Continued)

(56) References Cited

U.S. PATENT DOCUMENTS 5,930,647 A * 7/1999 Mathews .......... H01L 21/76202
257/E21.552
10,032,786 B2 7/2018 Wu et al.
(Continued)

OTHER PUBLICATIONS

Chen, et al. "Endurance/Retention Trade-off on HfO2/Metal Cap 1T1R Bipolar RRAM." IEEE Transactions on Electron Devices, vol. 60, No. 3, Mar. 2013.

*Primary Examiner* — Eric A. Ward
*Assistant Examiner* — Eric K Ashbahian
(74) *Attorney, Agent, or Firm* — Eschweiler & Potashnik, LLC

(57) ABSTRACT

A method for forming an integrated circuit (IC) and an IC are disclosed. The method for forming the IC includes: forming an isolation structure separating a memory semiconductor region from a logic semiconductor region; forming a memory cell structure on the memory semiconductor region; forming a memory capping layer covering the memory cell structure and the logic semiconductor region; performing a first etch into the memory capping layer to remove the memory capping layer from the logic semiconductor region, and to define a slanted, logic-facing sidewall on the isolation structure; forming a logic device structure on the logic semiconductor region; and performing a second etch into the memory capping layer to remove the memory capping layer from the memory semiconductor, while leaving a dummy segment of the memory capping layer that defines the logic-facing sidewall.

20 Claims, 23 Drawing Sheets

(51) Int. Cl.
  *H01L 21/311* (2006.01)
  *H01L 29/66* (2006.01)
  *H01L 21/762* (2006.01)
  *H01L 29/78* (2006.01)
  *H01L 29/06* (2006.01)
  *H01L 21/266* (2006.01)
  *H01L 21/321* (2006.01)
  *H01L 29/51* (2006.01)
  *H01L 21/3105* (2006.01)
  *H01L 29/08* (2006.01)
  *H01L 21/265* (2006.01)

(52) U.S. Cl.
  CPC .. *H01L 21/76224* (2013.01); *H01L 27/11509* (2013.01); *H01L 29/0649* (2013.01); *H01L 29/665* (2013.01); *H01L 29/6684* (2013.01); *H01L 29/66545* (2013.01); *H01L 29/78391* (2014.09); *H01L 21/266* (2013.01); *H01L 21/26513* (2013.01); *H01L 21/31053* (2013.01); *H01L 21/3212* (2013.01); *H01L 29/0847* (2013.01); *H01L 29/516* (2013.01); *H01L 29/6656* (2013.01)

(58) Field of Classification Search
  CPC ......... H01L 27/11531; H01L 27/11546; H01L 27/11524; H01L 27/11529; H01L 21/76–76297; H01L 27/11573; H01L 27/11526; H01L 29/0649
  See application file for complete search history.

(56) References Cited

U.S. PATENT DOCUMENTS

| | | |
|---|---|---|
| 2004/0142532 A1 | 7/2004 | Lee et al. |
| 2008/0064228 A1 | 3/2008 | Timmins et al. |
| 2010/0052034 A1 | 3/2010 | Cheng et al. |
| 2010/0224961 A1 | 9/2010 | Summerfelt et al. |
| 2012/0168858 A1 | 7/2012 | Hong |
| 2014/0264537 A1* | 9/2014 | Sakamoto ......... H01L 27/11531 257/316 |
| 2015/0137206 A1* | 5/2015 | Liu .................. H01L 29/66825 257/316 |
| 2015/0263010 A1* | 9/2015 | Chuang ............ H01L 29/66545 257/319 |
| 2016/0035856 A1 | 2/2016 | van Bentum et al. |
| 2016/0064228 A1 | 3/2016 | van Bentum et al. |
| 2016/0071947 A1* | 3/2016 | Wiatr ................ H01L 21/28194 257/295 |
| 2016/0141298 A1* | 5/2016 | Chuang .............. H01L 29/0653 257/324 |
| 2016/0181268 A1* | 6/2016 | Chuang ........... H01L 21/823842 257/314 |
| 2017/0236833 A1 | 8/2017 | Chuang et al. |

\* cited by examiner

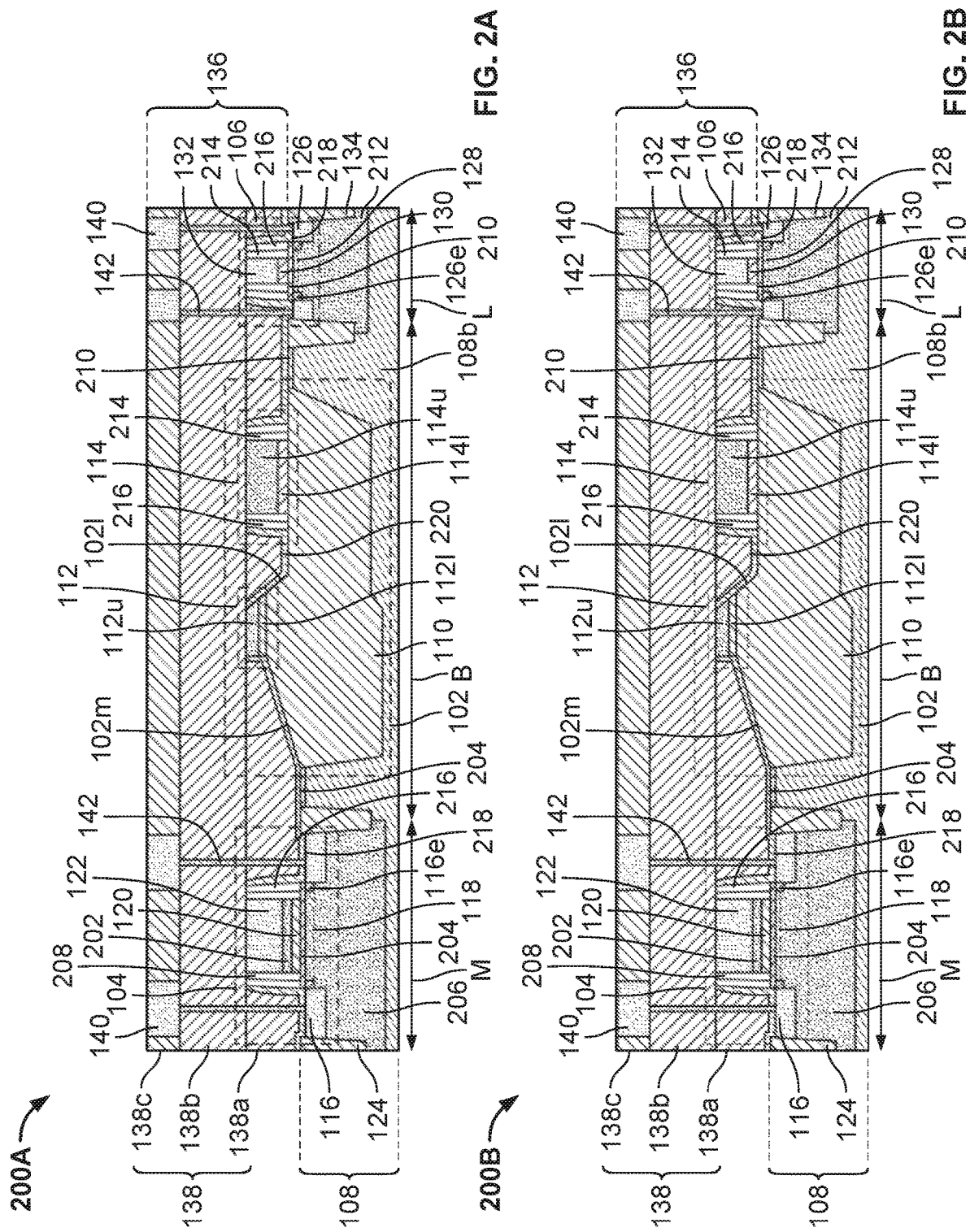

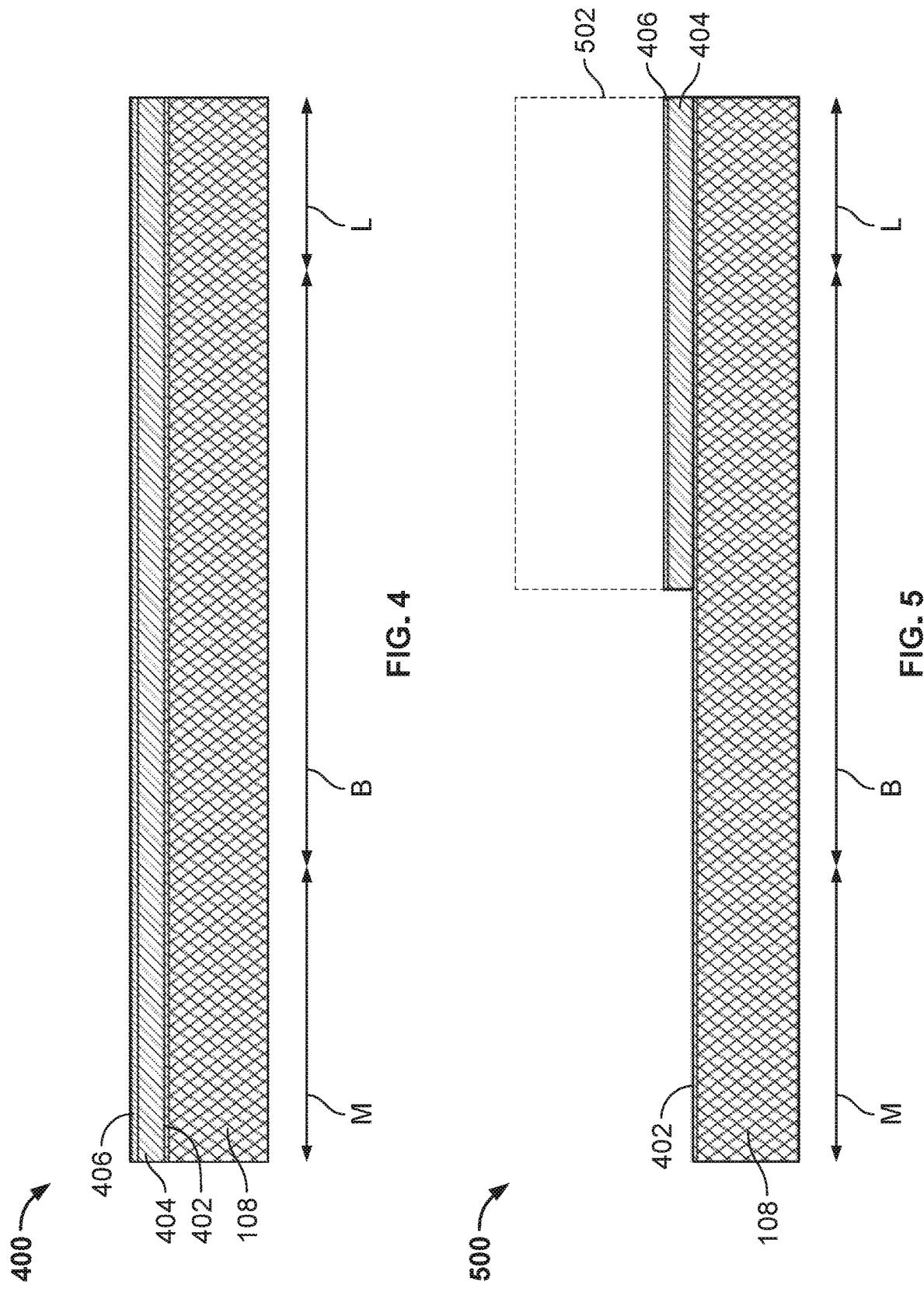

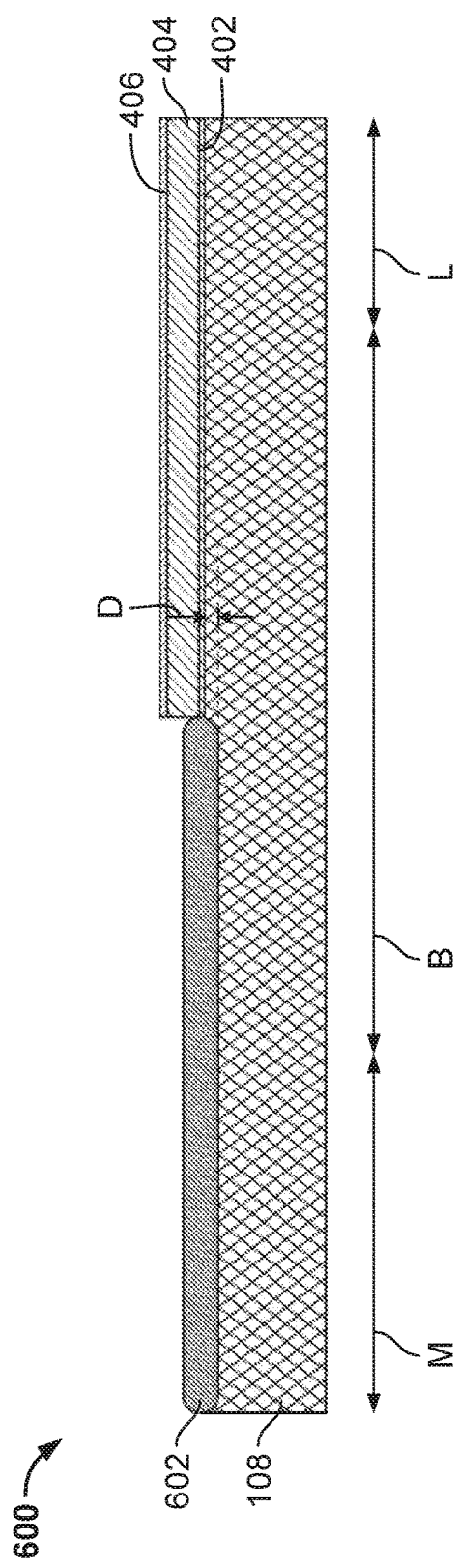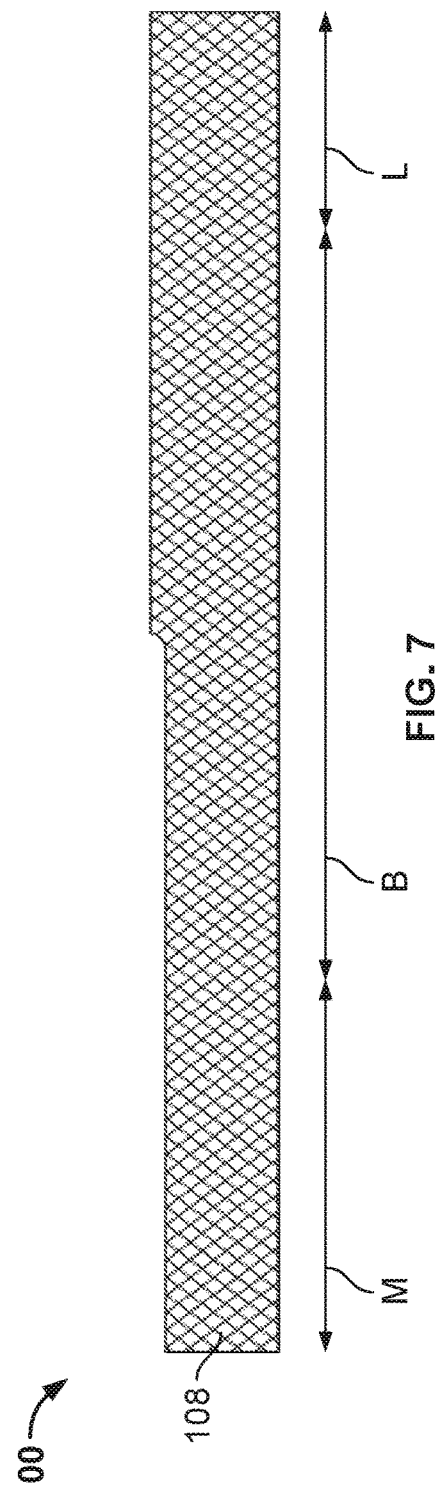

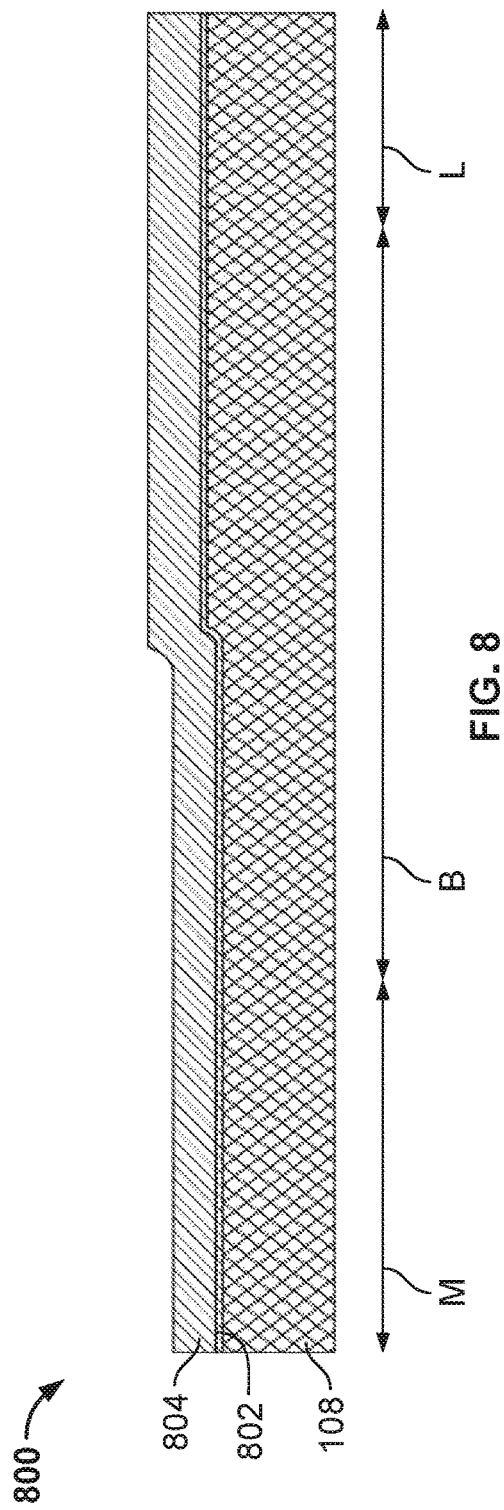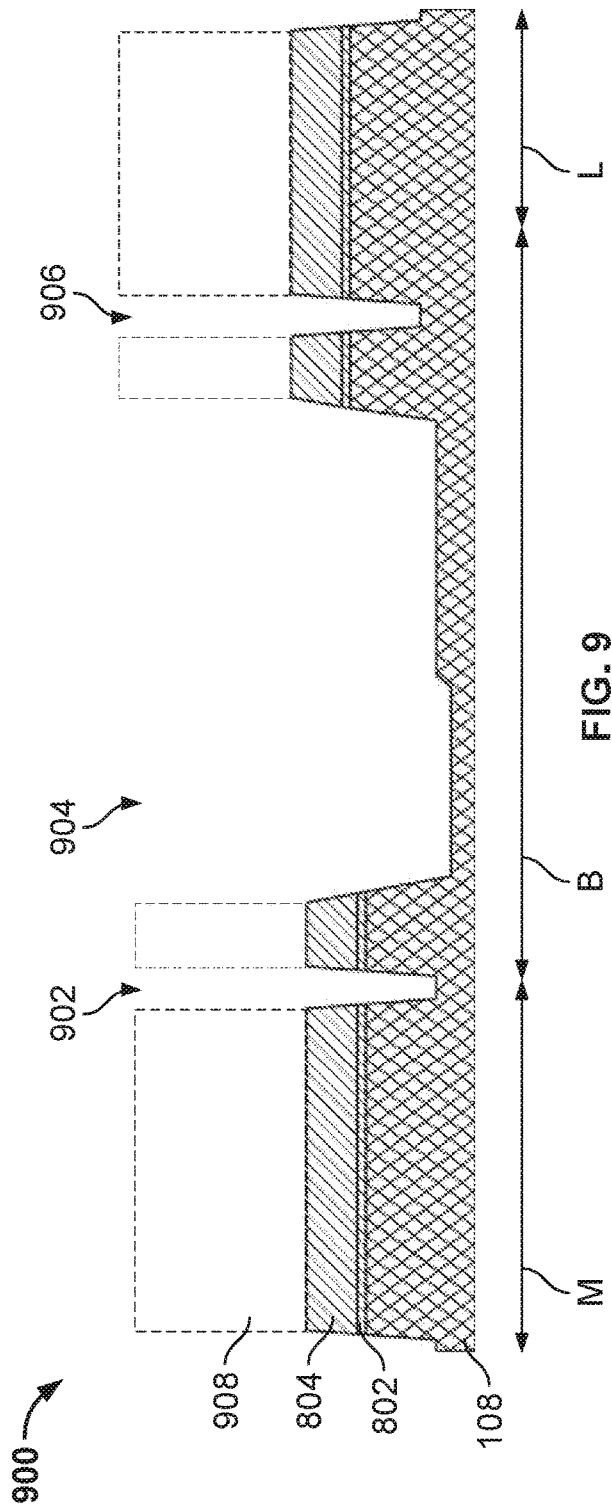

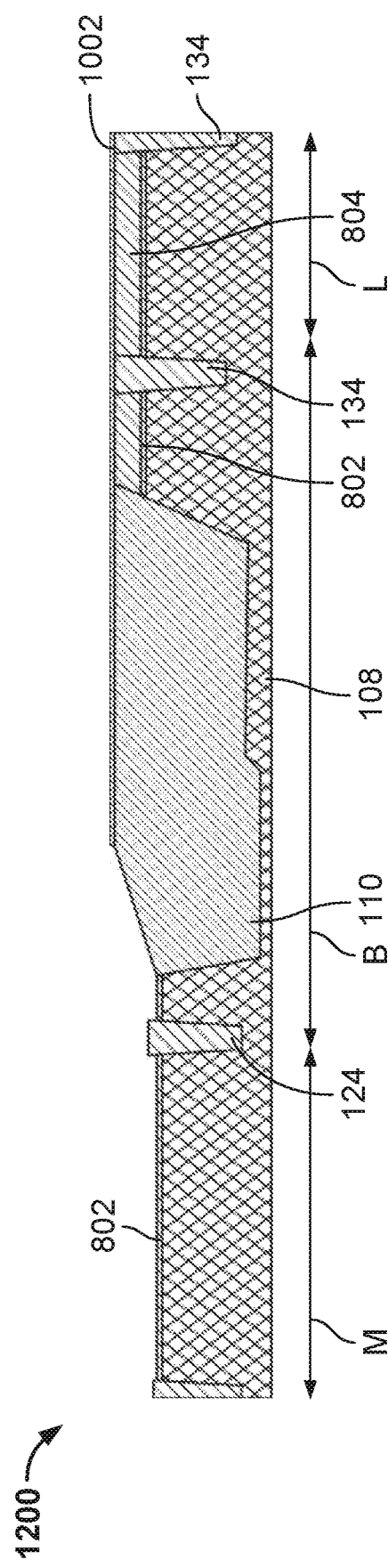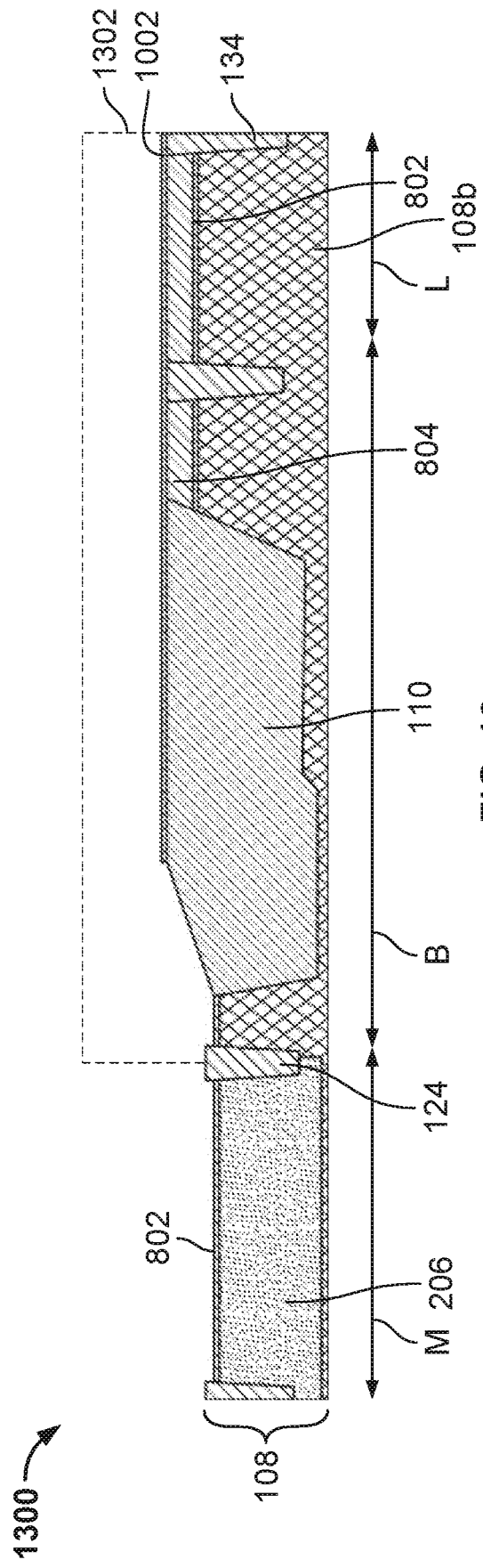

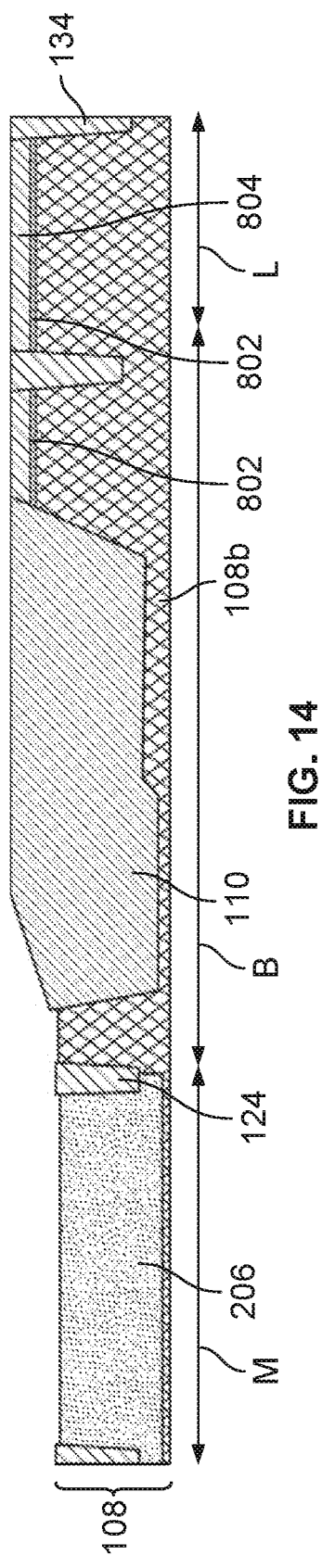
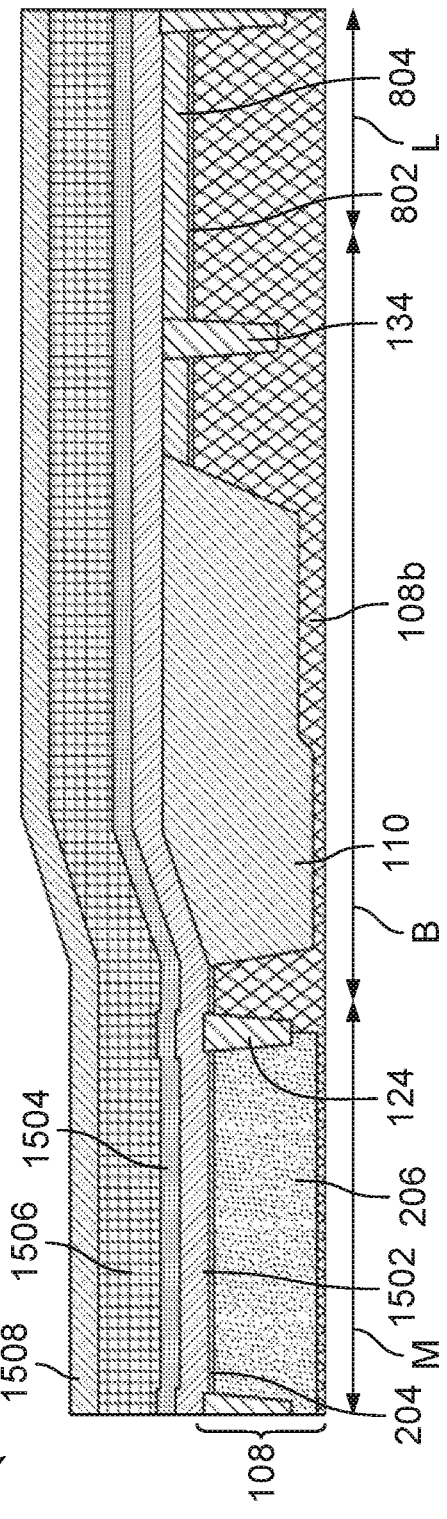

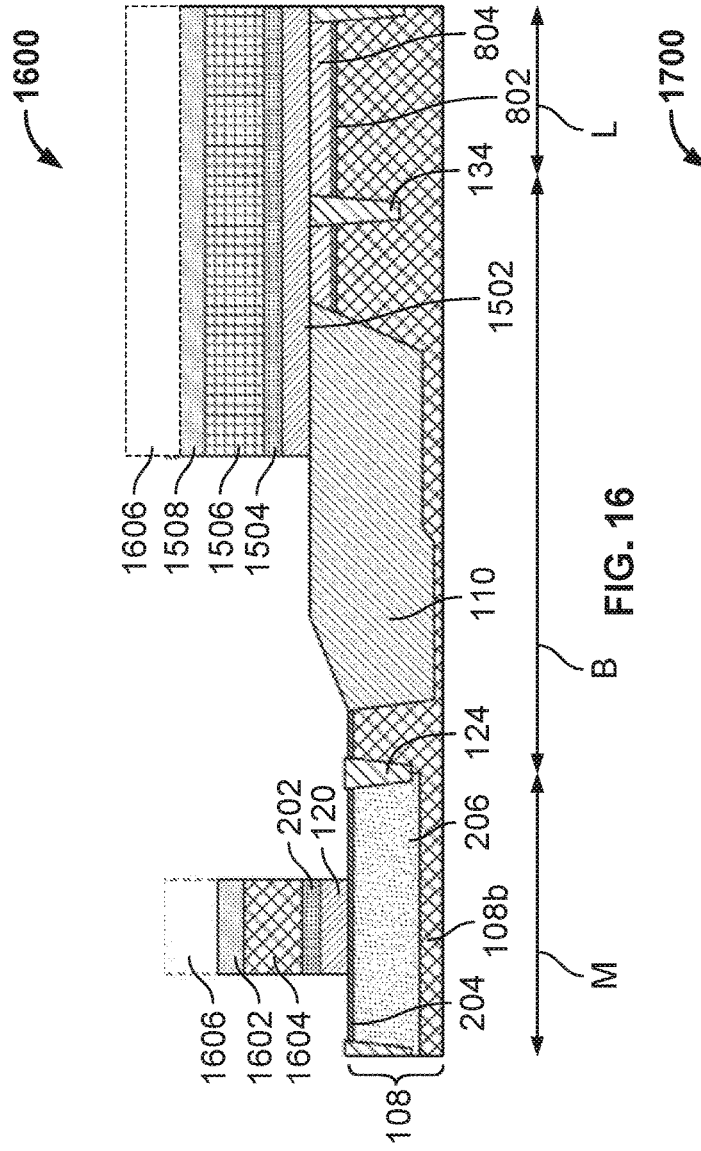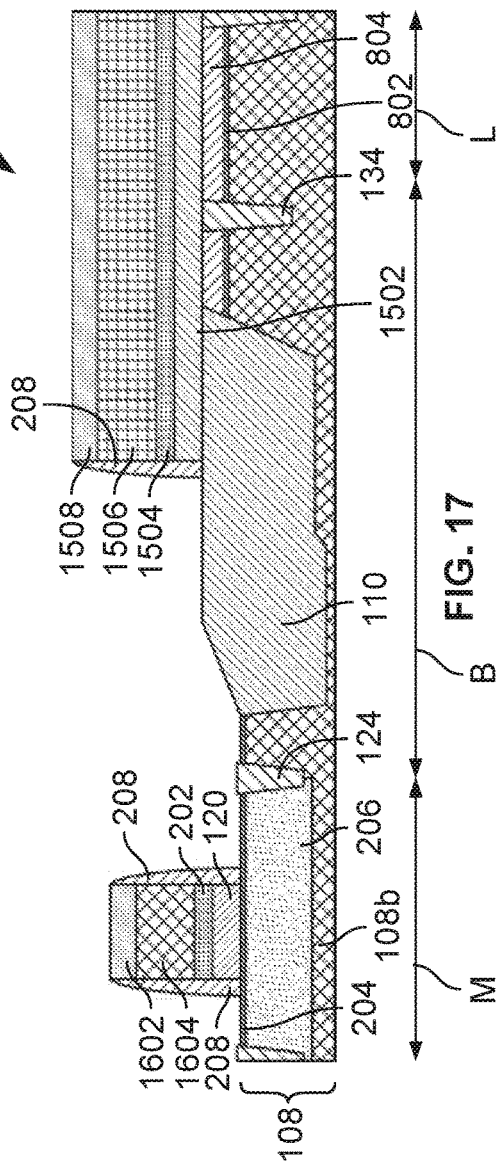

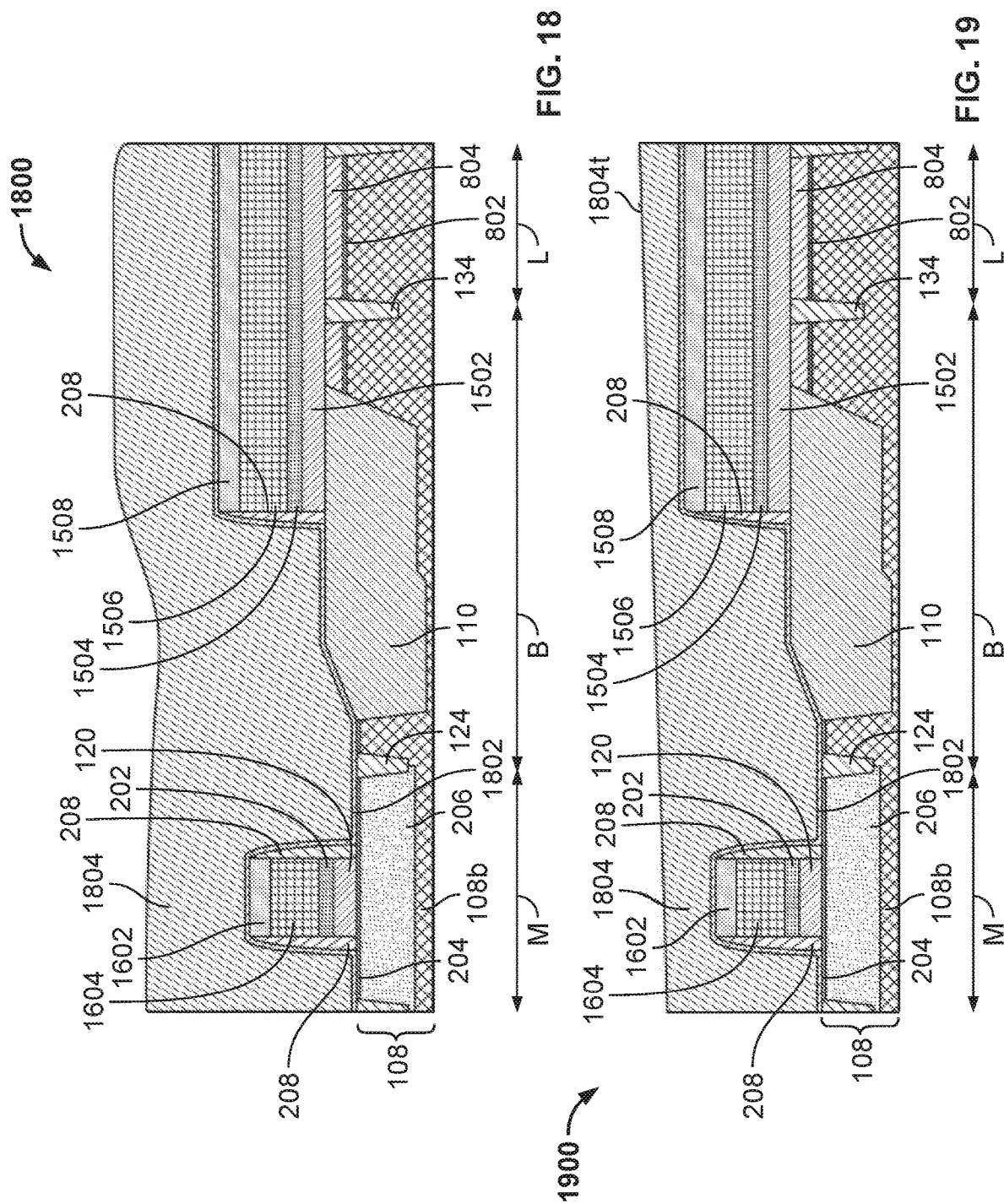

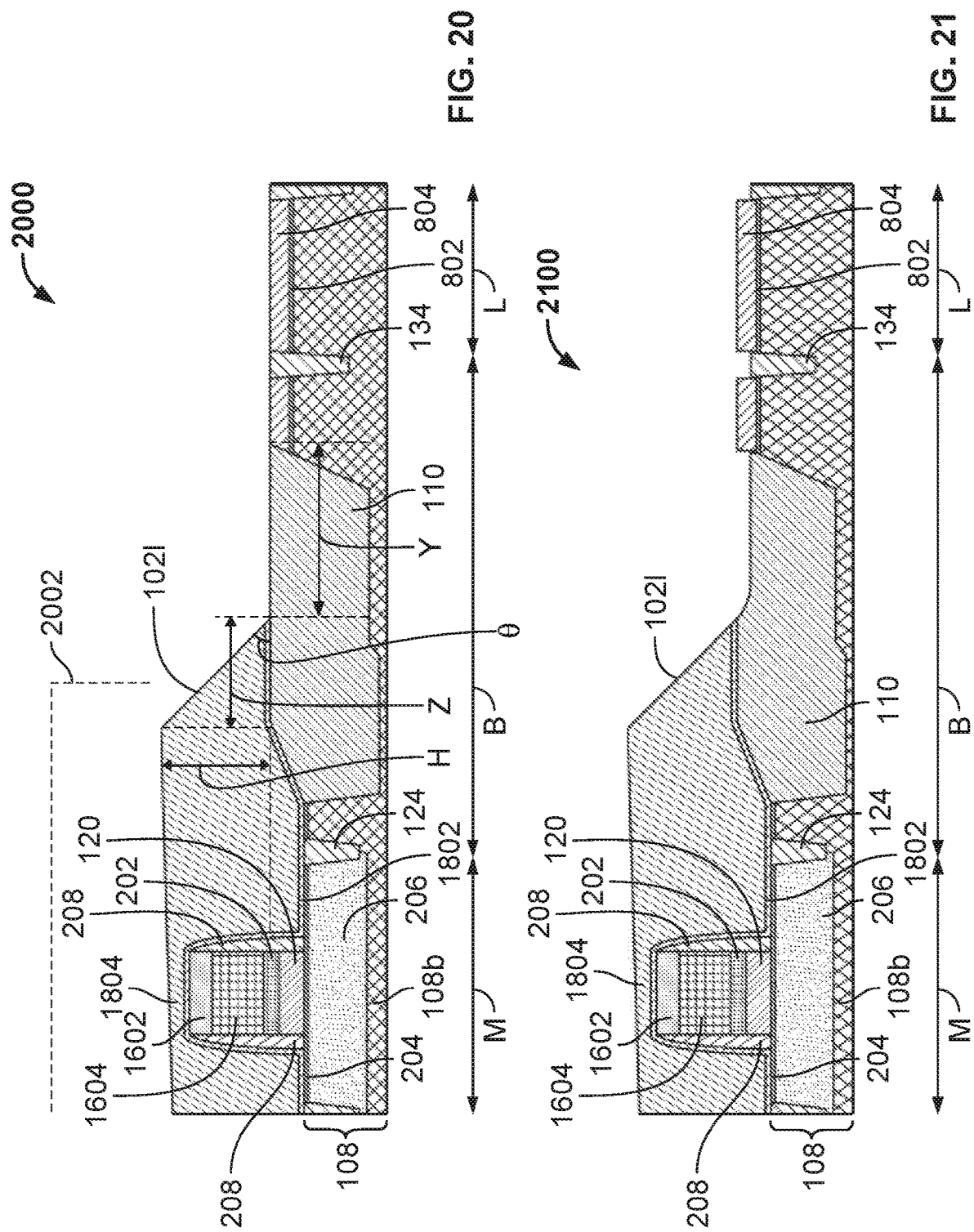

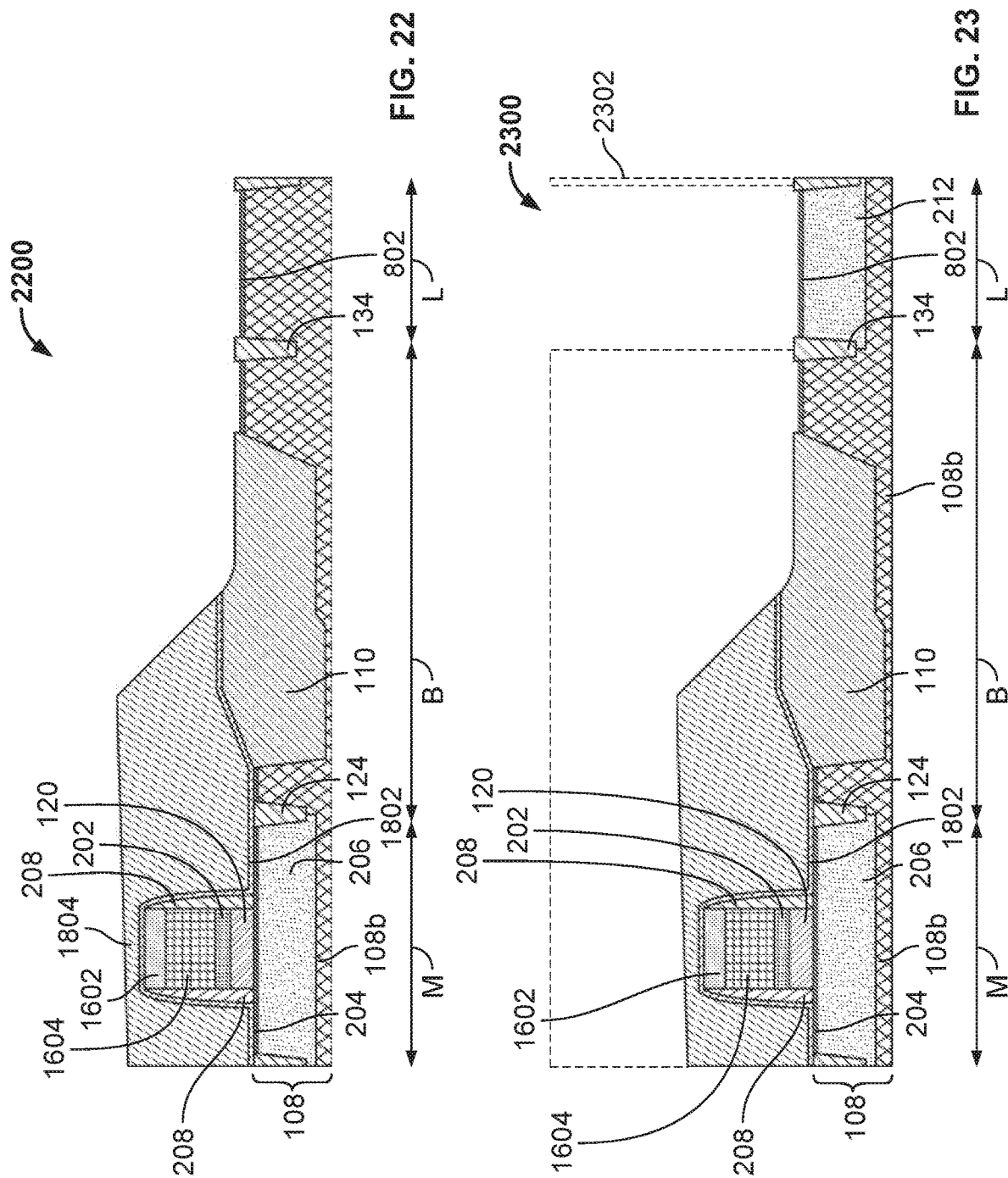

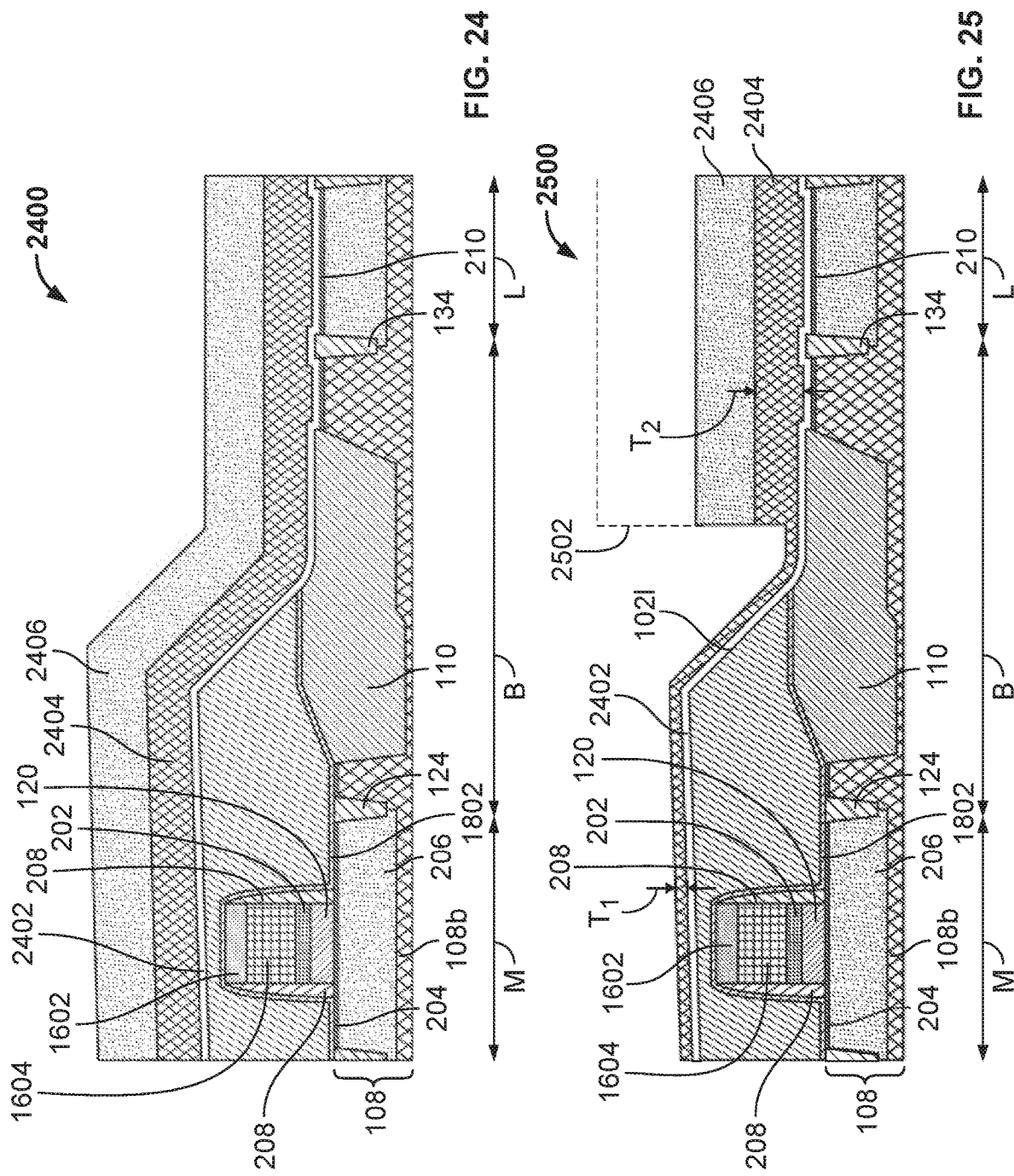

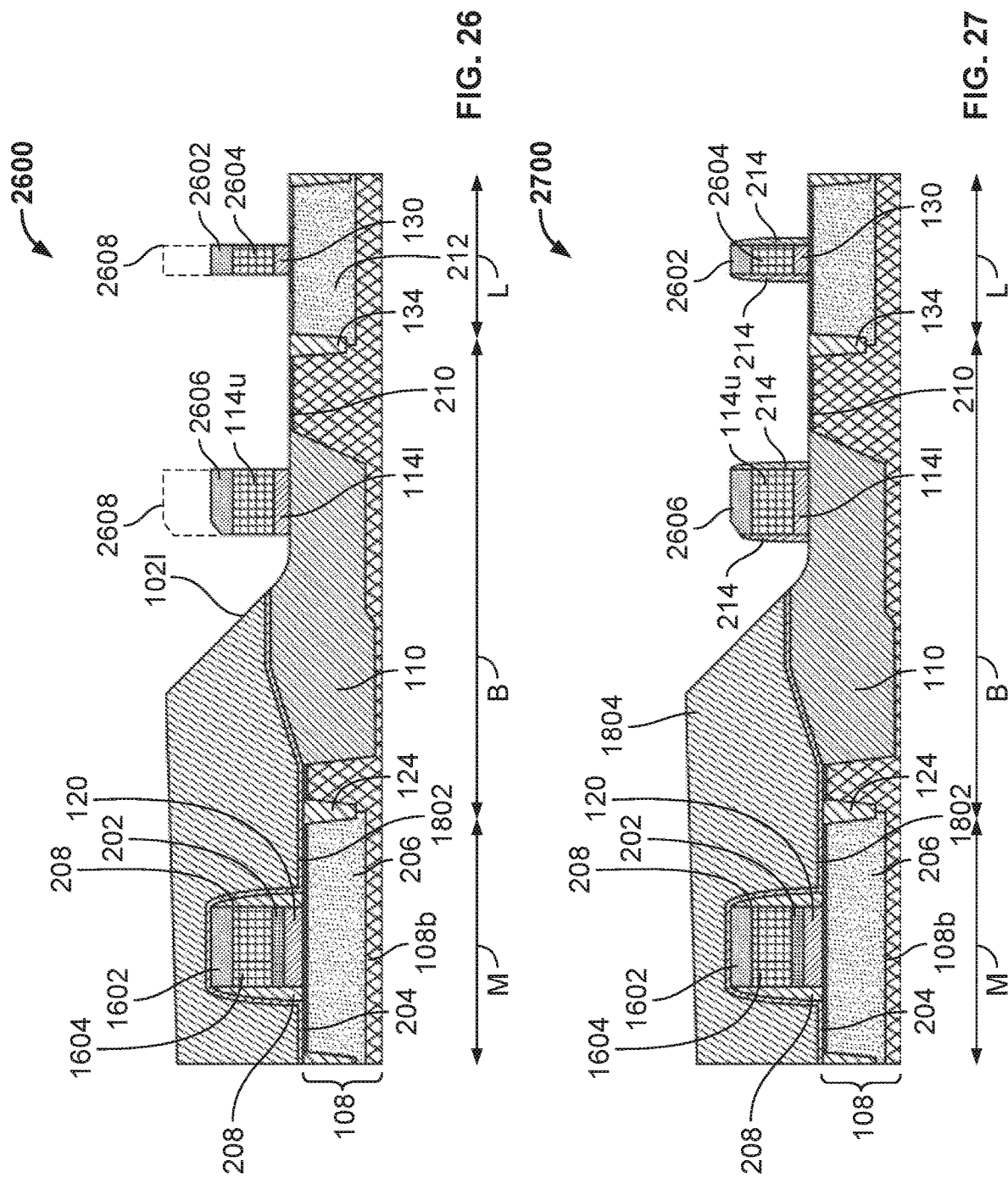

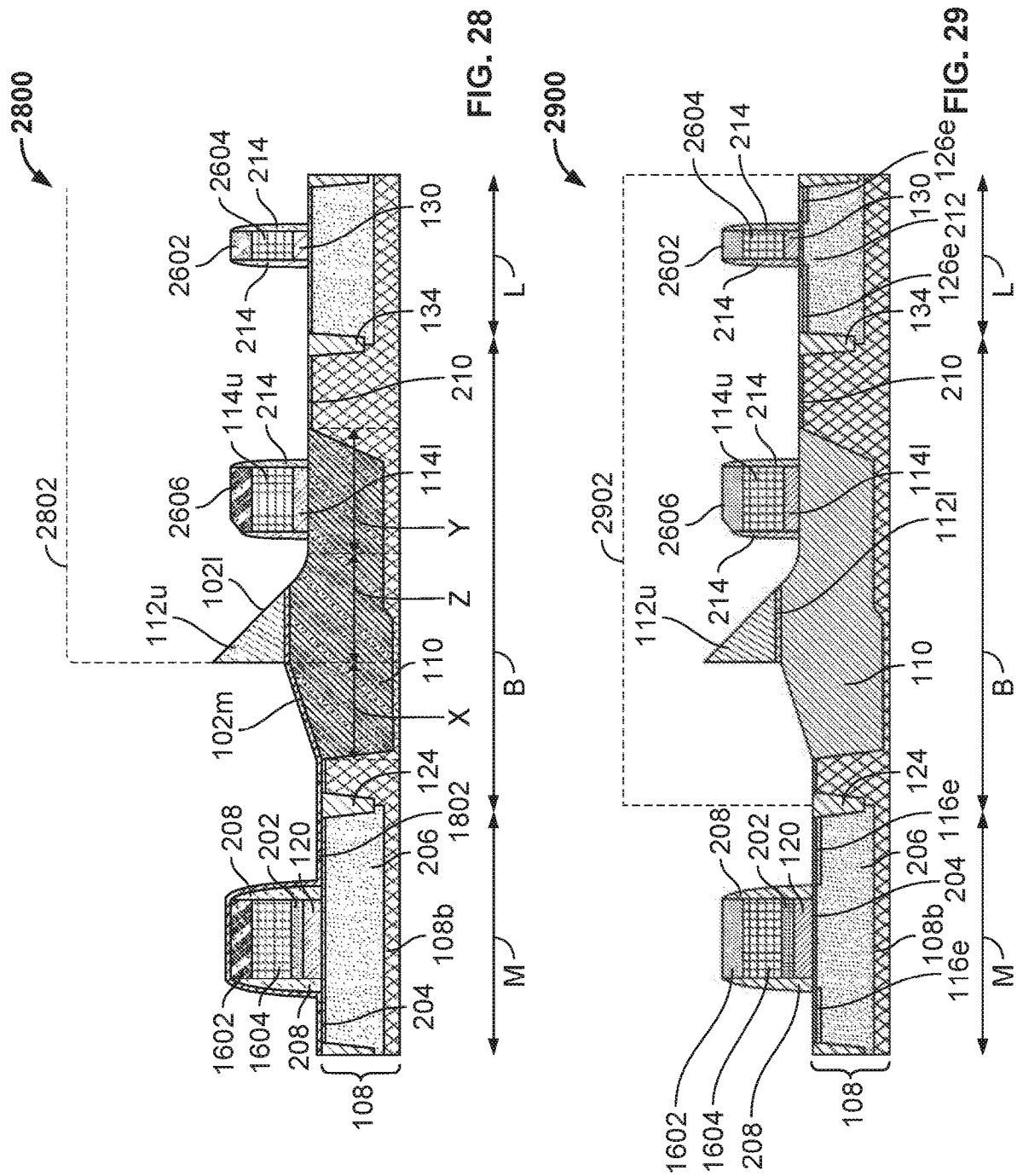

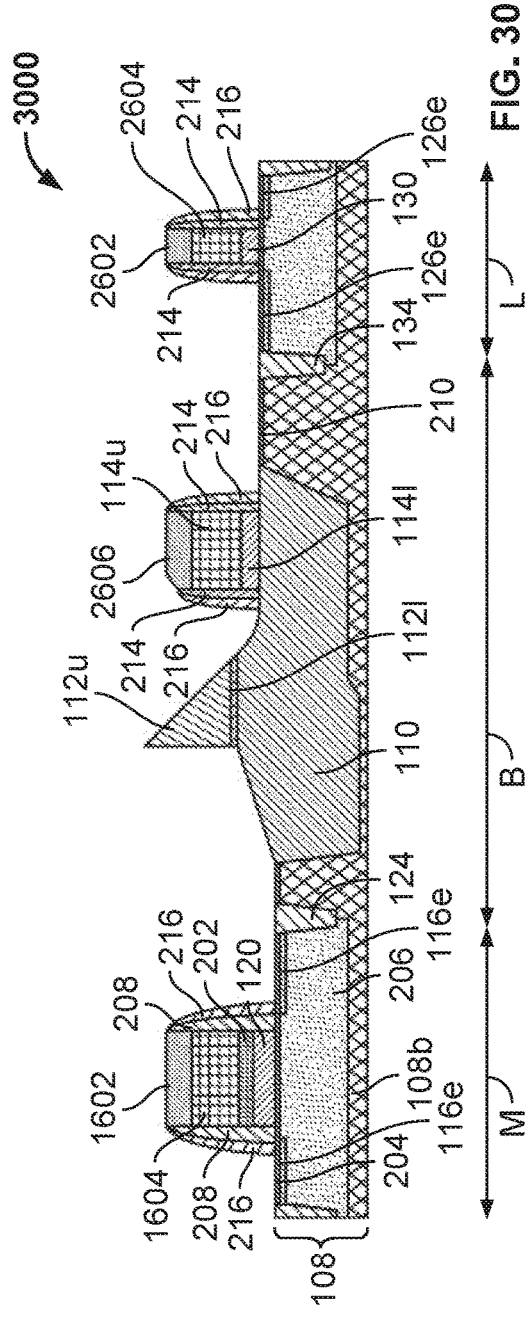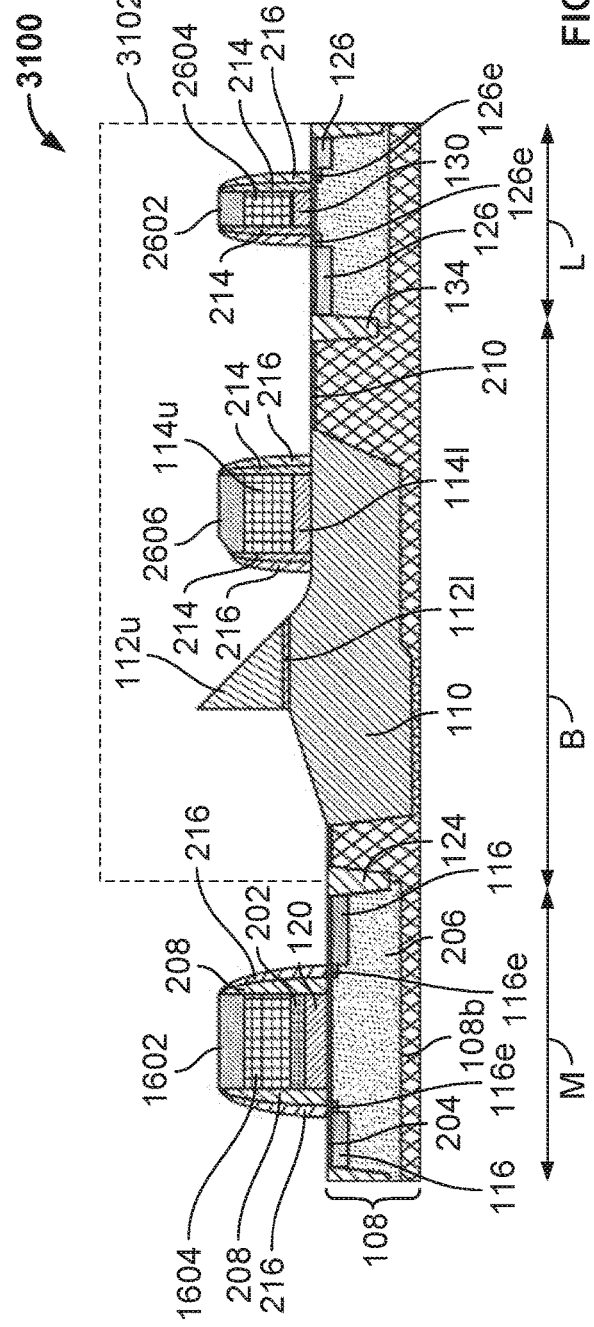

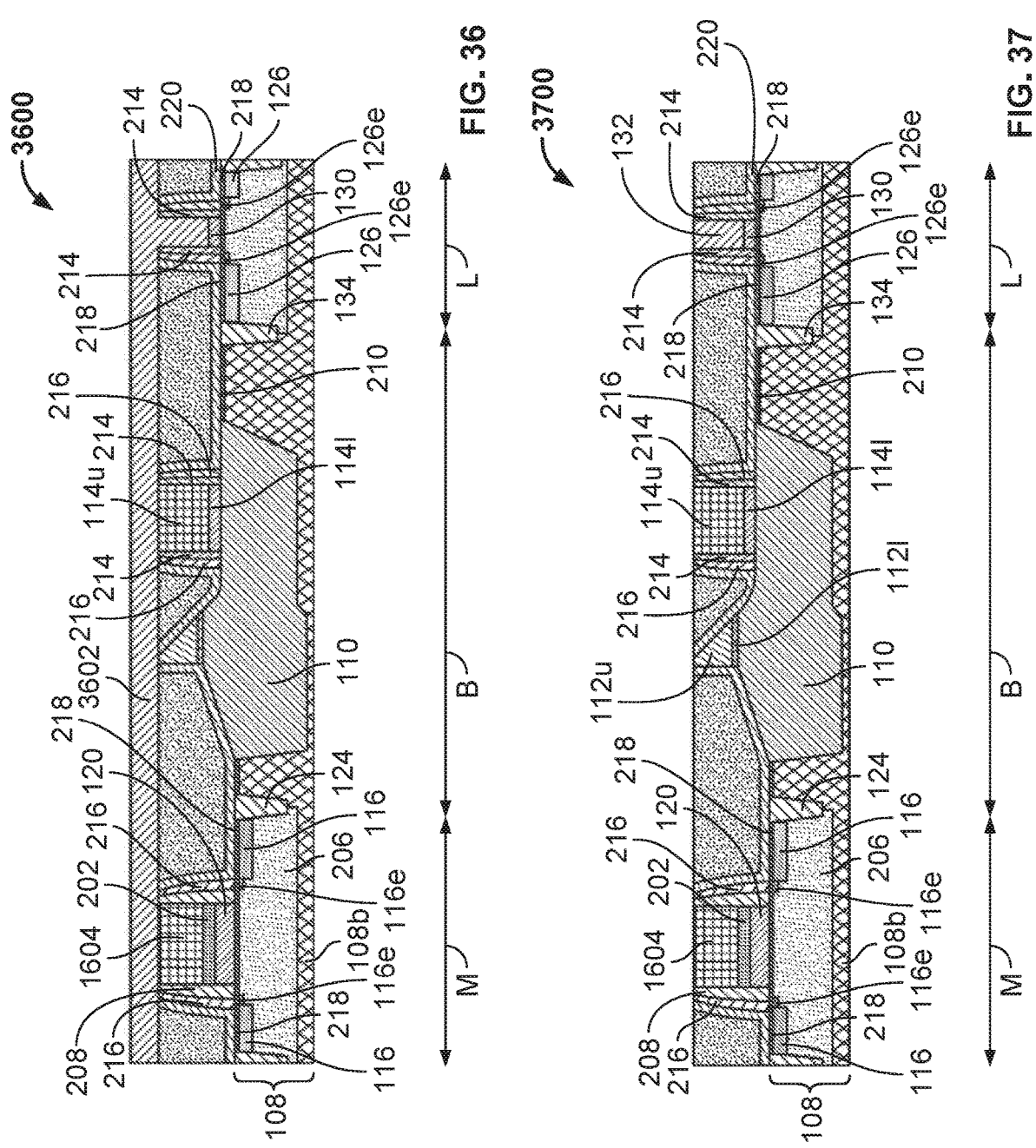

METHOD FOR FORMING AN INTEGRATED CIRCUIT AND AN INTEGRATED CIRCUIT

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component that can be created) has decreased. Some advancements in the evolution of ICs include embedded memory technology and high κ metal gate (HKMG) technology. Embedded memory technology is the integration of memory devices with logic devices on the same semiconductor chip, such that the memory devices support operation of the logic devices. High κ metal gate (HKMG) technology is the manufacture of semiconductor devices using metal gate electrodes and high-κ gate dielectric layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B illustrate cross-sectional views of various more detailed embodiments of the IC of FIGS. 1A and 1B.

FIGS. 4-39 illustrate a series of cross-sectional views of some embodiments of a method for forming an IC comprising a boundary structure separating a memory cell and a logic device, where the boundary structure has a tapered logic-facing sidewall.

DETAILED DESCRIPTION

Figure 1A:
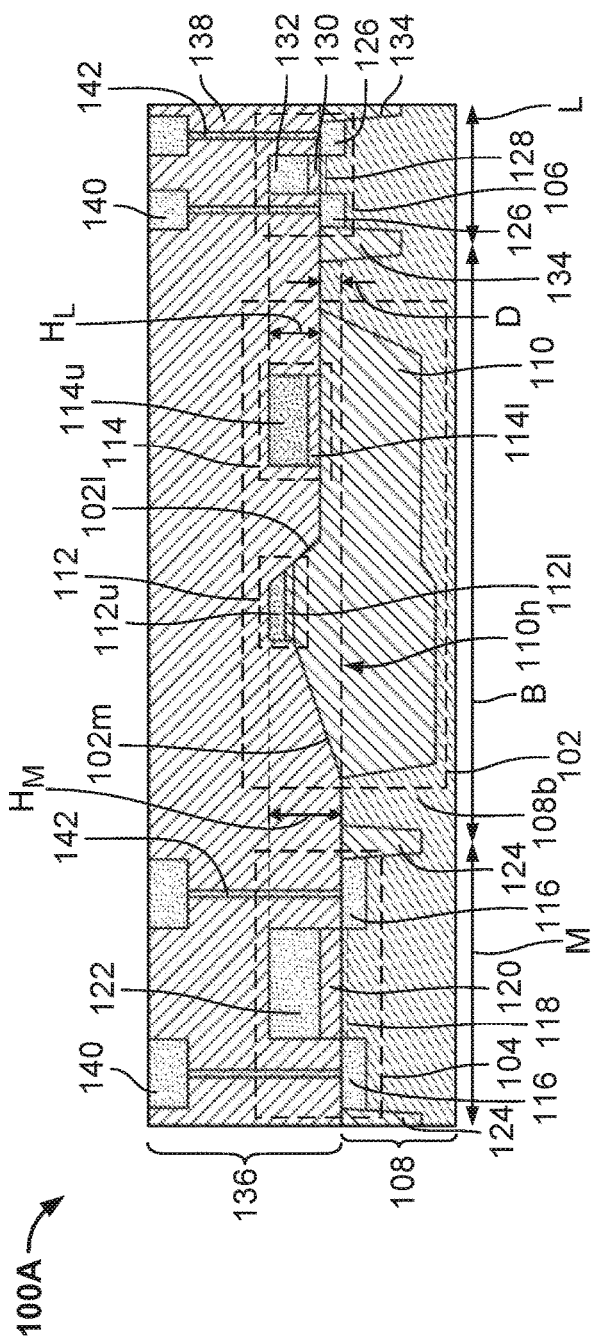
FIGS. 1A and 1B illustrate various cross-sectionals views of some embodiments of an integrated circuit (IC) comprising a boundary structure separating a memory cell and a logic device, where the boundary structure has a tapered logic-facing sidewall.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

According to some methods for manufacturing an integrated circuit (IC), a boundary isolation structure is formed in a semiconductor substrate, separating a memory semiconductor region and a logic semiconductor region. A memory cell structure is formed on the memory semiconductor region. A memory capping layer is formed covering the memory cell structure and partially defining a logic-facing sidewall overlying the boundary isolation structure. A multilayer logic film is formed on the memory capping layer, the logic-facing sidewall, and the logic semiconductor region. The multilayer logic film comprises a high κ dielectric layer and a dummy gate layer. The multilayer logic film is patterned to form a logic device structure on the logic semiconductor region, and the memory capping layer is removed from the memory cell structure. A planarization is performed into the memory cell structure and the logic device structure to expose dummy gates of the memory cell and logic device structures. The exposed dummy gates are replaced with metal gate electrodes.

A challenge with the methods is that the patterning of the multilayer logic film may fail to fully remove the high κ gate dielectric from the logic-facing sidewall. Namely, the logic-facing sidewall is vertical, such that the high κ gate dielectric layer has a vertical segment extending along an entire height of the logic-facing sidewall. Further, the patterning is performed by a vertical etch, such that the vertical etch has to etch through the vertical segment, along the entire height of the logic-facing sidewall, to fully remove the vertical segment. However, the height of the logic-facing sidewall tends to be larger than a thickness of the high κ gate dielectric layer, whereby the vertical etch does not persist long enough to fully remove the vertical segment. Further, to the extent that the vertical etch does persist long enough to fully remove the vertical segment, structure underlying the high κ gate dielectric layer would be damaged. Additionally, the logic-facing sidewall is defined by multiple materials with different etch rates, such that lateral recesses may form in the logic-facing sidewall between the forming of the logic-facing sidewall and the patterning of the multilayer logic film. These recesses trap material of the high κ gate dielectric layer and make it difficult to fully remove the high κ gate dielectric layer from the logic-facing sidewall.

Remaining high κ dielectric material on the logic-facing sidewall may diffuse or otherwise move into the semiconductor substrate, thereby changing doping profiles of semiconductor devices on the semiconductor substrate. The change in doping profiles may, in turn, render semiconductor devices on the semiconductor substrate inoperable and/or unsuitable for their intended purpose. Further, remaining high κ dielectric material may contaminate process tools used to form the IC, and other ICs formed using the contaminated process tools may be negatively affected in the same manner described above.

Various embodiments of the present application are directed to a method for forming an IC comprising a boundary structure separating a memory cell and a logic device, where the boundary structure has a tapered logic-facing sidewall. In some embodiments, an isolation structure is formed on a semiconductor substrate. The isolation structure separates a memory semiconductor region of the semiconductor substrate from a logic semiconductor region of the semiconductor substrate. A memory cell structure is formed on the memory semiconductor region. A memory capping layer is formed covering the memory cell structure and the logic semiconductor region. A first etch is performed into the memory capping layer to remove the memory capping layer from the logic semiconductor region, but not the memory semiconductor region. The first etch defines a logic-facing sidewall on the isolation structure, and the logic-facing sidewall slants downward towards the logic semiconductor region. A logic device structure is formed on the logic semiconductor region with the memory capping layer in place. The logic device structure comprises a high κ logic gate dielectric layer and a logic gate overlying the high κ logic gate dielectric layer. A second etch is performed into the memory capping layer to remove the memory capping layer from the memory semiconductor, while leaving a dummy segment of the memory capping layer that defines the logic-facing sidewall.

By forming the logic-facing sidewall with a slanted profile, high κ dielectric material may be completely removed from the logic-facing sidewall while patterning deposited high κ dielectric material into the high κ logic gate dielectric layer. For example, the slanted profile increases surface area along which an etchant may interact with high κ dielectric material on the logic-facing sidewall, thereby allowing complete removal of high κ dielectric material from the logic-facing sidewall. This, in turn, increases bulk manufacturing yields and the reliability of semiconductor devices formed on the semiconductor substrate. Namely, any residual high κ material could diffuse into the semiconductor substrate, and could change doping profiles of the semiconductor substrate, whereby operating parameters of semiconductor devices on the semiconductor substrate may be changed and/or the semiconductor devices may be rendered inoperable. This, in turn, would reduce bulk manufacturing yields and/or reduce device reliability. Additionally, residual high κ material may contaminate process tools used to form the IC, thereby contaminating other ICs as described above.

With reference to FIG. 1A, a cross-sectional view 100A of some embodiments of an IC comprising a boundary structure 102 separating a memory cell 104 and a logic device 106 is provided. The boundary structure 102 overlies a semiconductor substrate 108, at an IC boundary region B of the IC. The boundary structure 102 comprises a boundary isolation structure 110, a dummy memory structure 112, and a dummy logic structure 114. The semiconductor substrate 108 may be or comprise, for example, a bulk silicon substrate, a group III-V substrate, a silicon-on-insulator (SOI) substrate, or some other suitable semiconductor substrate.

The boundary isolation structure 110 extends into a top of the semiconductor substrate 108 and comprises a hillock 110h. The hillock 110h is along a top of the boundary isolation structure 110 and is closer to the memory cell 104 than to the logic device 106. Further, the hillock 110h partially or wholly defines a memory-facing boundary sidewall 102m and partially or wholly defines a logic-facing boundary sidewall 102l. The memory-facing boundary sidewall 102m faces the memory cell 104 and is slanted downward from a top of the hillock 110h towards the memory cell 104. The logic-facing boundary sidewall 102l faces the logic device 106 and is slanted downward from a top of the hillock 110h towards the logic device 106. In some embodiments, the memory-facing boundary sidewall 102m is slanted at a shallower angle than the logic-facing boundary sidewall 102l. In some embodiments, the memory-facing boundary sidewall 102m and/or the logic-facing boundary sidewall 102l is/are each smooth from top to bottom. In some embodiments, the memory-facing boundary sidewall 102m and/or the logic-facing boundary sidewall 102l is/are each are continuously from top to bottom. In some embodiments, the memory-facing boundary sidewall 102m and/or the logic-facing boundary sidewall 102l is/are each have a line-shaped profile from top to bottom. The boundary isolation structure 110 may be or comprise, for example, a shallow trench isolation (STI) structure, a deep trench isolation (DTI) structure, or some other suitable isolation structure.

The dummy memory structure 112 overlies the hillock 110h and, in some embodiments, partially defines the logic-facing boundary sidewall 102l. The dummy memory structure 112 comprises a lower dummy memory layer 112l and an upper dummy memory layer 112u. The upper dummy memory layer 112u overlies the lower dummy memory layer 112l, and may be or comprise, for example, silicon oxide, silicon nitride, silicon oxynitride, silicon carbide, some other suitable dielectric(s), polysilicon, aluminum copper, tantalum, some other suitable metal(s) or metal alloy(s), tantalum nitride, titanium nitride, some other suitable metal nitride(s), some other suitable material(s), or any combination of the foregoing. As used herein, a term (e.g., dielectric) with a suffix of "(s)" may, for example, be singular or plural. The lower dummy memory layer 112l is a different material than the upper dummy memory layer 112u, and may be or comprise, for example, silicon oxide, some other suitable dielectric(s), or any combination of the foregoing. In some embodiments, the lower dummy memory layer 112l is or comprises silicon oxide or some other suitable dielectric, and the upper dummy memory layer 112u is or comprises polysilicon or some other suitable material.

The dummy logic structure 114 overlies the boundary isolation structure 110, between the dummy memory structure 112 and the logic device 106. The dummy logic structure 114 comprises a lower dummy logic layer 114l and an upper dummy logic layer 114u. The upper dummy logic layer 114u overlies the lower dummy logic layer 114l, and may be or comprise, for example, polysilicon, silicon nitride, silicon oxynitride, silicon carbide, some other suitable dummy material(s), or any combination of the foregoing. The lower dummy logic layer 114l is a different material than the upper dummy logic layer 114u, and may be or comprise, for example, silicon oxide, a high κ dielectric, some other suitable dielectric(s), or any combination of the foregoing. In some embodiments, the lower dummy logic layer 114l is or comprises a high κ dielectric or some other suitable dielectric, and the upper dummy logic layer 114u is or comprises polysilicon or some other suitable material.

As seen hereafter, the dummy memory structure 112 and the dummy logic structure 114 may reduce dishing and/or erosion during some metal gate replacement processes. For example, some metal gate replacement processes may perform a chemical mechanical polish (CMP) into memory cell structures and logic cell structures respectively at an IC memory region M of the IC and an IC logic region L of the IC to expose dummy gates of these structures. Without the dummy memory structure 112 and/or the dummy logic structure 114, the CMP may more quickly planarize the IC boundary region B relative to the IC memory and logic regions M, L, thereby causing dishing and uneven removal of the material from the IC memory and logic regions M, L. Such uneven removal leads to non-uniform memory cells and/or non-uniform logic devices, which may negatively impact bulk manufacturing yields.

The memory cell 104 overlies the semiconductor substrate 108, at the IC memory region M, and may be, for example, one of many memory cells defining a memory cell array. The memory cell 104 may be or comprise, for example, a ferroelectric random-access-memory (FeRAM) cell, an erasable programmable read-only memory (EPROM) tunnel oxide (ETOX) memory cell, or some other suitable memory cell. In some embodiments, a memory height $H_M$ of the memory cell 104 is between about 1000-4500 angstroms, about 1000-2500 angstroms, about 2500-4500 angstroms, or about 2000-3000 angstroms. Other values for the memory height $H_M$ are, however, amenable. The memory cell 104 comprises a pair of memory source/drain regions 116, a selectively-conductive memory channel 118, a data storage element 120, and a memory gate electrode 122. The memory source/drain regions 116 are doped regions of the semiconductor substrate 108 and overlie a bulk semiconductor region 108b of the semiconductor substrate 108. Further, the memory source/drain regions 116 are laterally spaced by the selectively-conductive memory channel 118. In some embodiments, the selectively-conductive memory channel 118 is in the bulk semiconductor region 108b, and the bulk semiconductor region 108b has an opposite doping type as the memory source/drain regions 116. For example, the memory source/drain regions 116 may be n-type, and the bulk semiconductor region 108b may be p-type, or vice versa.

The data storage element 120 and the memory gate electrode 122 are stacked on the selectively-conductive memory channel 118, such that the memory gate electrode 122 overlies the data storage element 120. Further, the data storage element 120 and the memory gate electrode 122 are sandwiched laterally between the memory source/drain regions 116. The data storage element 120 is configured to reversibly change between a first data state and a second data state so as to store a bit of data. In embodiments in which the memory cell 104 is a FeRAM cell, the data storage element 120 may be or comprise, for example, silicon doped hafnium oxide, lead zirconate titanate (PZT), or some other suitable ferroelectric material. The memory gate electrode 122 may be or comprise, for example, doped polysilicon, metal, some other suitable conductive material(s), or any combination of the foregoing.

In some embodiments in which the memory source/drain regions 116 are n-type, the memory gate electrode 122 is n-type polysilicon, a metal with an n-type work function, or some other suitable conductive material with an n-type work function. As used herein, an n-type work function may, for example, be: 1) a work function within about 0.1 eV, 0.2 eV, or 0.4 eV of a work function for n-type polycrystalline silicon; 2) a work function less than about 4.0 eV, 4.2 eV, or 4.4 eV; 3) a work function between about 3.5-4.4 eV, 4.0-4.4 eV, or 3.8-4.5 eV; 4) other suitable n-type work functions; or 5) any combination of the foregoing. As used herein, a metal with an n-type work function may be or comprise, for example, hafnium, zirconium, titanium, tantalum, aluminum, some other suitable n-type work function metal(s), or any combination of the foregoing. In some embodiments in which the memory source/drain regions 116 are p-type, the memory gate electrode 122 is p-type polysilicon, a metal with a p-type work function, or some other suitable conductive material with a p-type work function. As used herein, a p-type work function may, for example, be: 1) a work function within about 0.1 eV, 0.2 eV, or 0.4 eV of a work function for p-type polycrystalline silicon; 2) a work function greater than about 4.8 eV, 5.0 eV, or 5.2 eV; 3) a work function between about 4.8-5.2 eV, 5.0-5.4 eV, or 4.6-5.6 eV; 4) other suitable p-type work functions; or 5) any combination of the foregoing. As used herein, a metal with a p-type work function may be, for example, ruthenium, palladium, platinum, cobalt, nickel, titanium aluminum nitride, tungsten carbon nitride, some other suitable p-type work function metal(s), or any combination of the foregoing.

A memory isolation structure 124 extends into a top of the semiconductor substrate 108 to electrically and physically separate the memory cell 104 from surrounding structure. In some embodiments, the memory isolation structure 124 comprises a pair of memory isolation segments. The memory isolation segments are respectively on opposite sides of the memory cell 104, such that the memory cell 104 is sandwiched between the memory isolation segments. The memory isolation structure 124 may be or comprise, for example, a STI structure, a DTI structure, or some other suitable isolation structure(s).

The logic device 106 overlies the semiconductor substrate 108, at the IC logic region L, and may be or comprise, for example, a metal-oxide-semiconductor (MOS) transistor, an insulated-gate field-effect transistor (IGFET), or some other suitable logic device. Further, the logic device 106 has a logic height $H_L$ less than the memory high $H_M$. The logic height $H_L$ may, for example, be between about 500-3500 angstroms, about 500-2000 angstroms, about 2000-3500 angstroms, or about 2000-2400 angstroms. Other values for the logic height $H_L$ are, however, amenable. The logic device 106 comprises a pair of logic source/drain regions 126, a selectively-conductive logic channel 128, a logic gate dielectric layer 130, and a logic gate electrode 132. The logic source/drain regions 126 are doped regions of the semiconductor substrate 108 and overlie the bulk semiconductor region 108b. Further, the logic source/drain regions 126 are laterally spaced by the selectively-conductive logic channel 128. In some embodiments, the selectively-conductive logic channel 128 is in the bulk semiconductor region 108b, and the bulk semiconductor region 108b has an opposite doping type as the logic source/drain regions 126. For example, the logic source/drain regions 126 may be p-type, whereas the bulk semiconductor region 108b may be n-type, or vice versa.

The logic gate dielectric layer 130 and the logic gate electrode 132 are stacked on the selectively-conductive logic channel 128, such that the logic gate electrode 132 overlies the logic gate dielectric layer 130. Further, the logic gate dielectric layer 130 and the logic gate electrode 132 are sandwiched laterally between the logic source/drain regions 126. The logic gate dielectric layer 130 may be or comprise, for example, hafnium oxide, aluminum oxide, zirconium silicate, hafnium silicate, zirconium oxide, some other suitable high κ dielectric(s), silicon oxide, some other suitable dielectric(s), or any combination of the foregoing. The logic gate electrode 132 may be or comprise, for example, doped polysilicon, metal, some other suitable conductive material(s), or any combination of the foregoing. In some embodiments in which the logic source/drain regions 126 are n-type, the logic gate electrode 132 is n-type polysilicon, a metal with an n-type work function, or some other suitable conductive material with an n-type work function. In some embodiments in which the logic source/drain regions 126 are p-type, the logic gate electrode 132 is p-type polysilicon, a metal with a p-type work function, or some other suitable conductive material with a p-type work function. In some embodiments in which the logic gate electrode 132 is metal (e.g., p-type or n-type metal), the logic gate dielectric layer 130 is or comprise a high κ dielectric material or some other suitable dielectric.

By forming the logic-facing boundary sidewall 102l with a slanted and smooth profile, dielectric material deposited to form the logic gate dielectric layer 130 may be fully removed from the logic-facing boundary sidewall 102l while patterning the deposited dielectric material into the logic gate dielectric layer 130. Where the deposited dielectric material is or comprises high κ dielectric material, failure to fully remove the high κ dielectric material from the logic gate dielectric layer 130 may cause problems. Namely, residual high κ dielectric material on the logic-facing boundary sidewall 102l may diffuse or otherwise move into the semiconductor substrate 108, thereby changing doping profiles of semiconductor devices on the semiconductor substrate 108. The change in doping profiles may, in turn, lead to shifts in operating parameters of the semiconductor devices and/or render the semiconductor devices inoperable. Further, the residual high κ dielectric material may contaminate process tools used to form the IC, and may negatively affect other ICs formed using the contaminated process tools in the same manner described above. Therefore, by fully removing residual high κ dielectric material from the logic-facing boundary sidewall 102l, doping profiles of the semiconductor devices are free from change due to residual high κ dielectric material and/or process tools are free of contamination by residual high κ dielectric material. This may, in turn, lead to high bulk manufacturing yields.

In some embodiments, a first top surface portion of the semiconductor substrate 108 at the IC memory region M is recessed below a second top surface portion of the semiconductor substrate 108 at the logic region L by a distance D. As seen hereafter, the recessing may promote more uniform CMP loading and may increase bulk manufacturing yields during some metal gate replacement processes. For example, some metal gate replacement processes may perform a CMP into memory cell structures and logic cell structures respectively at the IC memory region M and the IC logic region L to expose dummy gates of these structures. Without the recessing, top surfaces of the memory cell structures may be substantially higher than top surfaces of the logic device structures since the memory cell structures have greater heights (i.e., $H_M > H_L$) than the logic device structures. As such, CMP loading may be higher at the IC memory region M, relative to the IC logic region L, and may cause the CMP to be slanted. The slanted CMP, in turn, leads non-uniform planarization of the memory cell and logic device structures, which leads to memory cells and logic devices with non-uniform operating parameters. The non-uniform operating parameters may, in turn, lead to low bulk manufacturing yields and/or semiconductor devices that are unsuitable for their intended purposes. Further, because of the height difference between the memory cell structures and the logic device structures, the memory cell structures may be substantially consumed by the CMP before dummy gates of the logic device structures are exposed. This, in turn, may destroy the memory cell structures and lead to low bulk manufacturing yields. Therefore, the recessing of the semiconductor substrate 108 may enhance bulk manufacturing yields.

In some embodiments, the distance D of the recessing is chosen as a difference between the memory height $H_M$ and the logic height $H_L$ so top surfaces respectively of the memory cell 104 and the logic device 106 are about even. As discussed above, this may enhance CMP loading while forming the IC of FIG. 1A. The distance D may, for example, be about 1-100 nanometers, about 1-30 nanometers, about 30-65 nanometers, about 65-100 nanometers, about 25-35 nanometers, or some other suitable recessing range(s).

A logic isolation structure 134 extends into a top of the semiconductor substrate 108 to electrically and physically separate the logic device 106 from surrounding structure. In some embodiments, the logic isolation structure 134 comprises a pair of logic isolation segments. The logic segments are respectively on opposite sides of the logic device 106, such that the logic device 106 is sandwiched between the logic isolation segments. The logic isolation structure 134 may be or comprise, for example, a STI structure, a DTI structure, or some other suitable isolation structure(s).

An interconnect structure 136 covers the boundary structure 102, the memory cell 104, and the logic device 106. The interconnect structure 136 comprises an interconnect dielectric layer 138, a plurality of wires 140, and a plurality of contact vias 142. For ease of illustration, only some of the wires 140 are labeled 140, and only some of the contact vias 142 are labeled 142. The wires 140 and the contact vias 142 are stacked in the interconnect dielectric layer 138, and the contact vias 142 extend from the wires 140 to the memory and logic source/drain regions 116, 126. The interconnect dielectric layer 138 may be or comprise, for example, silicon dioxide, a low κ dielectric, silicon nitride, some other suitable dielectric(s), or any combination of the foregoing. As used herein, a low κ dielectric may be, for example, a dielectric with a dielectric constant κ less than about 3.9, 3, 2, or 1. The wires 140 and the contact vias 142 may be or comprise, for example, copper, aluminum copper, aluminum, tungsten, some other suitable metal(s), or any combination of the foregoing.

Figure 1B:
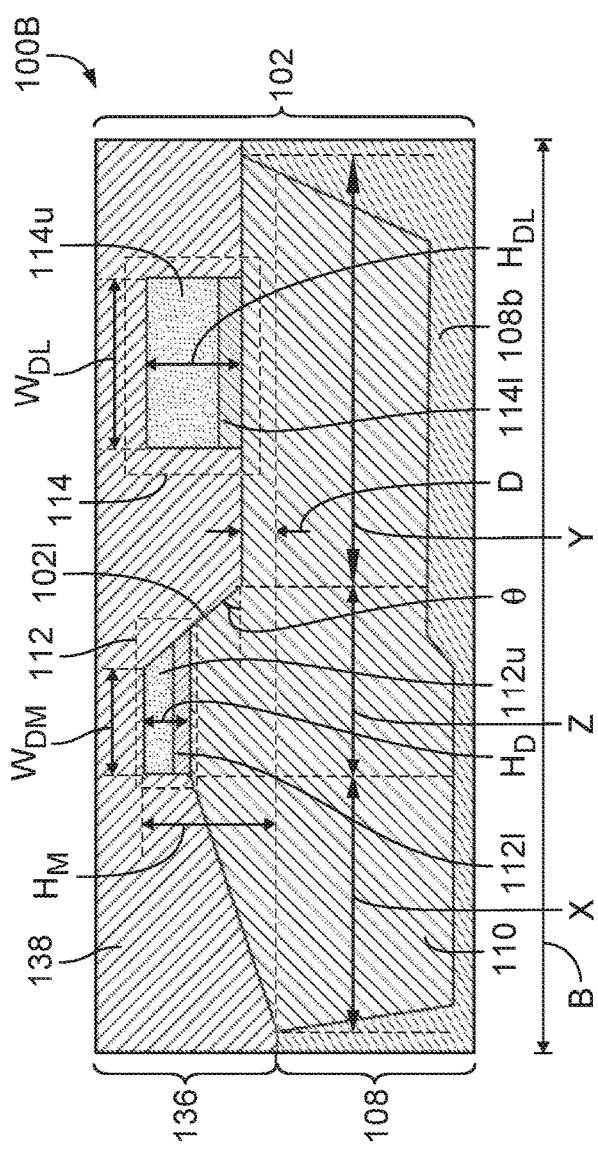

With reference to FIG. 1B, an enlarged cross-sectional view 100B of the boundary structure 102 of FIG. 1A is provided. As illustrated, the logic-facing boundary sidewall 102l is slanted at an angle θ. If the angle θ is too small (e.g., less than about 15 degrees or some other value), a dummy memory width $W_{DM}$ may be large, whereby the IC boundary region B may be large and chip area may be wasted. If the angle θ is too large (e.g., greater than about 75 degrees or some other value), high κ dielectric material may not be affectively removed from the logic-facing boundary sidewall 102l during formation of the IC of FIG. 1A. As noted above, high κ dielectric material remaining on the logic-facing boundary sidewall 102l after forming the logic device 106 may change doping profiles in the semiconductor substrate 108, whereby semiconductor devices on the semiconductor substrate 108 may be rendered inoperable and/or unsuitable for their intended purpose. Further, the remaining high κ dielectric material may contaminate process tools used to form the IC of FIG. 1A, and other ICs formed using the contaminated process tools may be negatively affected. The angle θ may be, for example, between about 15-75 degrees, about 15-40 degrees, about 40-75 degrees, or some other suitable range. Other values for the angle θ are, however, amenable.

In some embodiments, the angle θ is determined by trial and error. For example, the IC of FIG. 1A is formed using different angles θ for the logic-facing boundary sidewall 102l, and imaging is used to assess which angles θ result in affective removal of high κ dielectric material from the logic-facing boundary sidewall 102l. The imaging may, for example, be performed using a scanning electron microscope (SEM), a transmission electron microscope (TEM), or some other suitable microscope or imaging device.

Also illustrated by the enlarged cross-sectional view 100B of FIG. 1B, the dummy memory structure 112 has a dummy height $H_D$ and a dummy memory width $W_{DM}$. The dummy height $H_D$ may be, for example, between about 1000-1800 angstroms, about 1000-1400 angstroms, about 1400-1800 angstroms, or about 1200-1400 angstroms. The dummy memory width $W_{DM}$ may be, for example, between about 1000-10000 angstroms, about 1000-5000 angstroms, or about 5000-10000 angstroms. Other values for the dummy height $H_D$ and/or the dummy memory width $W_{DM}$ are, however, amenable.

In some embodiments, the dummy memory structure 112 has a sidewall laterally offset from a first edge of the boundary isolation structure 110 by a distance X. The distance X may, for example, be about 0.5-3.0 micrometers, about 0.5-1.75 micrometers, about 1.75-3.0 micrometers, or some other value or range of values. In some embodiments, the logic-facing boundary sidewall 102l slants downward towards the dummy logic structure 114 and ends a distance Y from a second edge of the boundary isolation structure 110, where the second edge is on an opposite side of the boundary isolation structure 110 as the first edge of the boundary isolation structure 110. The distance Y may, for example, be about 0.5-4.0 micrometers, about 0.5-2.25 micrometers, about 2.25-4.0 micrometers, or some other value or range of values. In some embodiments, the sidewall of the dummy memory structure 112 is separated from the end of the logic-facing boundary sidewall 102l by a distance Z. The distance Z may, for example, be about 0.1-3.0 micrometers, about 0.1-1.5 micrometers, about 1.5-3.0 micrometers, or some other value or range of values. In some embodiments, the boundary isolation structure 110 has a width equal to the sum of the distances X, Y, Z (e.g., X+Y+Z), and/or the sum of the distances X, Y, Z is between about 1-10 micrometers, about 1-5.5 micrometers, about 5.5-10 micrometers, or some other value or range of values.

If the sum of the distances X, Y, Z is too large, chip area may be wasted. If the sum of the distances X, Y, Z is too small, the dummy memory structure 112 and/or the dummy logic structure 114 may be too small to affectively reduce dishing and/or erosion during some metal gate replacement processes. For example, some metal gate replacement processes may perform a CMP into memory cell structures and logic cell structures respectively at an IC memory region M of the IC (see FIG. 1A) and an IC logic region L of the IC (see FIG. 1A) to expose dummy gates of these structures. If the dummy memory structure 112 and/or the dummy logic structure 114 is/are too small, the CMP may more quickly planarize the IC boundary region B relative to the IC memory and logic regions M, L, thereby causing dishing and uneven removal of material from the IC memory and logic regions M, L. In some embodiments, the distances X, Y, Z are determined by trial and error. For example, the IC of FIG. 1A is formed using different values for the distances X, Y, Z, and imaging is used to assess whether the dummy memory structure 112 and/or the dummy logic structure 114 affectively reduce dishing and/or erosion during a metal gate replacement process. The imaging may, for example, be performed using a SEM, a TEM, or some other suitable microscope or imaging device.

The dummy logic structure 114 has a dummy logic width $W_{DL}$. The dummy logic width $W_{DL}$ may, for example, be between about 1000-10000 angstroms, about 1000-5000 angstroms, or about 5000-10000 angstroms. Other values for dummy logic width $W_{DL}$ are, however, amenable. Further, the dummy logic structure 114 has a dummy logic height $H_{DL}$. The dummy logic height $H_{DL}$ may, for example, be within about 10-300 angstroms of the logic height $H_L$ (see FIG. 1A), about 10-150 angstroms of the logic height $H_L$, or about 150-300 angstroms of the logic height $H_L$. Other values for dummy logic height $H_{DL}$ are, however, amenable.

With reference to FIG. 2A, a cross-sectional view 200A of some more detailed embodiments of the IC of FIGS. 1A and 1B is provided in which the IC includes some additional features (discussed hereafter). Further, the features originally from FIGS. 1A and 1B are subject to modification (e.g., changes in geometry, location, etc.) to accommodate the additional features. For example, the memory source/drain regions 116 may be laterally spaced from the memory gate electrode 122 to accommodate memory source/drain extensions 116e.

As illustrated, a data capping element 202 overlies the data storage element 120, between the data storage element 120 and the memory gate electrode 122. The data capping element 202 is conductive and, in some embodiments, is a diffusion barrier for material of the memory gate electrode 122. For example, the data capping element 202 may prevent metal of the memory gate electrode 122 from diffusing into the data storage element 120. In some of these embodiments, the data capping element 202 may be or comprise, for example, titanium nitride, tantalum nitride, some other suitable diffusion barrier material, or any combination of the foregoing. In some embodiments in which the data storage element 120 comprises oxygen, the data capping element 202 has a low reactivity with oxygen. Such a low reactivity may, for example, be a reactivity that depends upon about 5-10 electron volts (eV) of energy, about 5-7 eV of energy, about 7-10 eV of energy, greater than about 5 eV of energy to react with oxygen, or some other amount of energy indicative of a low reactivity. In some of these embodiments, the data capping element 202 may be or comprise, for example, titanium nitride, tantalum nitride, platinum, iridium, tungsten, some other suitable material(s) with low oxygen reactivity, or any combination of the foregoing.

An interfacial layer 204 underlies the data storage element 120, between the semiconductor substrate 108 and the data storage element 120. In some embodiments, the interfacial layer 204 increases adhesion of the data storage element 120 to the semiconductor substrate 108. In some embodiments, the interfacial layer 204 aids in formation of the data storage element 120. In some embodiments, the interfacial layer 204 electrically insulates the data storage element 120 from the semiconductor substrate 108. The interfacial layer 204 may be or comprise, for example, silicon oxide, silicon oxynitride, a non-ferroelectric high κ dielectric, some other suitable dielectric(s), or any combination of the foregoing.

A memory well 206 underlies the memory cell 104, between the memory source/drain regions 116 and the bulk semiconductor region 108b. The memory well 206 is doped region of the semiconductor substrate 108 and has an opposite doping type as the memory source/drain regions 116. Further, a pair of memory source/drain extensions 116e overlies the memory well 206, laterally between the memory source/drain regions 116. The memory source/drain extensions 116e respectively border the memory source/drain regions 116, and the selectively-conductive memory channel 118 extends from one of the memory source/drain extensions 116e to another one of the memory source/drain extensions 116e. The memory source/drain extensions 116e are doped regions of the semiconductor substrate 108, and have the same doping type as, but a lesser doping concentration than, the memory source/drain regions 116.

A memory sidewall spacer 208 overlies the semiconductor substrate 108, at the IC memory region M, and comprises a pair of memory sidewall spacer segments. The memory sidewall spacer segments respectively border opposite sidewalls of the memory gate electrode 122 and are each between the memory gate electrode 122 and an individual one of memory source/drain regions 116. The memory sidewall spacer 208 may be or comprise, for example, silicon nitride, silicon oxynitride, silicon oxide, some other suitable dielectric(s), or any combination of the foregoing.

A logic dielectric layer 210 underlies the logic gate dielectric layer 130, between the semiconductor substrate 108 and the logic gate dielectric layer 130. In some embodiments, the logic dielectric layer 210 may be or comprise, for example, silicon oxide, silicon oxynitride, some other suitable dielectric(s), or any combination of the foregoing.

A logic well 212 underlies the logic device 106, between the logic source/drain regions 126 and the bulk semiconductor region 108b. The logic well 212 is a doped region of the semiconductor substrate 108 and has an opposite doping type as the logic source/drain regions 126. In some embodiments, the logic well 212 adjoins the logic isolation structure 134. In other embodiments, the logic well 212 is spaced from the logic isolation structure 134. Further, a pair of logic source/drain extensions 126e overlies the logic well 212, laterally between the logic source/drain regions 126. The logic source/drain extensions 126e respectively border the logic source/drain regions 126, and the selectively-conductive logic channel 128 extends from one of the logic source/drain extensions 126e to another one of the logic source/drain extensions 126e. The logic source/drain extensions 126e are doped regions of the semiconductor substrate 108, and have the same doping type as, but a lesser doping concentration than, the logic source/drain regions 126.

Logic sidewall spacers 214 overlie the semiconductor substrate 108, respectively at the IC logic region L and the IC boundary region B. The logic sidewall spacers 214 comprise a first pair of logic sidewall spacer segments and a second pair of logic sidewall spacer segments. The logic sidewall spacer segments of the first pair respectively border opposite sidewalls of the logic gate electrode 132 and are each between the logic gate electrode 132 and an individual one of logic source/drain regions 126. The logic sidewall spacer segments of the second pair respectively border opposite sidewalls of the dummy logic structure 114. The logic sidewall spacers 214 may be or comprise, for example, silicon nitride, silicon oxynitride, silicon oxide, some other suitable dielectric(s), or any combination of the foregoing.

Additional sidewall spacers 216 respectively border the memory and logic sidewall spacers 208, 214. The additional sidewall spacers 216 comprise a first pair of additional sidewall spacer segments at the IC memory region M, a second pair of additional sidewall spacer segments at the IC logic region L, and a third pair of additional sidewall spacer segments at the IC boundary region B. The additional sidewall spacer segments of the first pair respectively overlie the memory source/drain extensions 116e. The additional sidewall spacer segments of the second pair respectively overlie the logic source/drain extensions 126e. The additional sidewall spacers of the third pair border the dummy logic structure 114. The additional sidewall spacers 216 may be or comprise, for example, silicon nitride, silicon oxynitride, silicon oxide, silicon nitride, some other suitable dielectric(s), or any combination of the foregoing.

Silicide pads 218 cover the memory and logic source/drain regions 116, 126, and a contact etch stop layer 220 covers the silicide pads 218. Further, the contact etch stop layer 220 covers the semiconductor substrate 108, the boundary isolation structure 110, the memory isolation structure 124, and the logic isolation structure 134 between the memory cell 104, the logic device 106, the dummy memory structure 112, and the dummy logic structure 114. The silicide pads 218 provide ohmic coupling between the contact vias 142 and the memory and logic source/drain regions 116, 126. The silicide pads 218 may be or comprise, for example, nickel silicide, tungsten silicide, titanium silicide, cobalt silicide, some other suitable silicide(s), or any combination of the foregoing. The contact etch stop layer 220 provides an etch stop while forming the contact vias 142 and may be or comprise, for example, silicon oxide, silicon nitride, some other suitable dielectric(s), or any combination of the foregoing.

The interconnect dielectric layer 138 comprises a first interlayer dielectric (ILD) layer 138a, a second ILD layer 138b, and an intermetal dielectric (IMD) layer 138c stacked upon one another. The first ILD layer 138a is between the memory cell 104, the logic device 106, the dummy memory structure 112, and the dummy logic structure 114. Further, the first ILD layer 138a has a top surface that is about even with top surfaces respectively of the memory cell 104, the logic device 106, the dummy memory structure 112, and the dummy logic structure 114. The second ILD layer 138b overlies the first ILD layer 138a, and the IMD layer 138c overlies the second ILD layer 138b. The wires 140 overlie the first and second ILD layers 138a, 138b, and the wires 140 are laterally surrounded by the IMD layer 138c. The contact vias 142 extend through the first and second ILD layers 138a, 138b, from the wires 140 to the silicide pads 218. The first and second ILD layers 138a, 138b and the IMD layer 138c may be or comprise, for example, silicon dioxide, a low κ dielectric, silicon nitride, some other suitable dielectric(s), or any combination of the foregoing. In some embodiments, the first and second ILD layers 138a, 138b are the same material, whereas the IMD layer 138c is a different material.

With reference to FIG. 2B, a cross-sectional view 200B of some alternative embodiments of the IC of FIG. 2A is provided in which a bottom of the logic-facing boundary sidewall 102l is rounded. By rounding the bottom of the logic-facing boundary sidewall, the logic-facing boundary sidewall 102l gradually transitions to the substantially horizontal upper surface of the boundary isolation structure 110. This may, for example, promote more efficient removal of high κ dielectric material on the logic-facing boundary sidewall 102l since the rounding increases the surface area along which an etchant used to remove the high κ dielectric material may interface with the high κ dielectric material.

Figure 3:
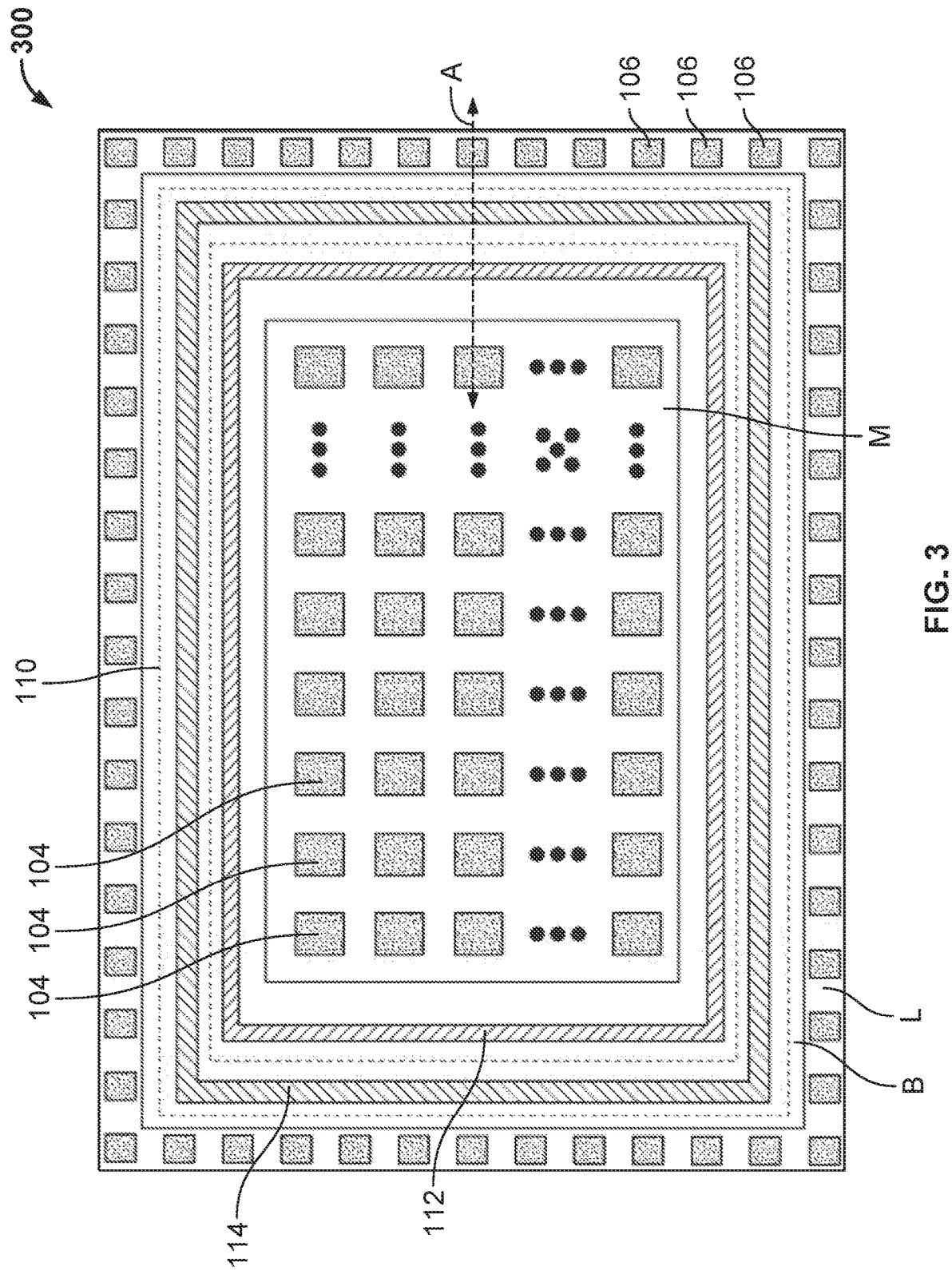
FIG. 3 illustrates a top layout view of some embodiments of the IC of FIGS. 1A and 1B.

With reference to FIG. 3, a top layout view 300 of some embodiments of the IC of any one of FIGS. 1A, 1B, 2A, and 2B is provided. The ICs of FIGS. 1A, 1B, 2A, and 2B may, for example, be taken along line A in FIG. 3. As illustrated, the IC boundary region B extends laterally in a closed path, along the boundary of the IC memory region M, to completely enclose the IC memory region M and to separate the IC memory region M from the IC logic region L. Further, the IC logic region L extends laterally in a closed path, along the boundary of the IC boundary region B, to completely enclose the IC boundary region B. For example, the IC boundary region B and/or the IC logic region L may each have a top layout that is circular ring-shaped, square ring-shaped, rectangular ring-shaped, or some other suitable closed-path shape.

At the IC memory region M, multiple memory cells 104 are arranged in rows and columns. For ease of illustration, only some of the multiple memory cells 104 are labeled 104. In some embodiments, the memory well 206 of FIGS. 2A and 2B (not shown) underlies the memory cells 104. At the IC boundary region B, the dummy memory structure 112 extends laterally in a closed path, along the boundary of the IC memory region M, to completely enclose the memory region M. Further, the dummy logic structure 114 extends laterally in a closed path, along the boundary of the dummy memory structure 112, to completely enclose the dummy memory structure 112. Further, the boundary isolation structure 110 (shown in phantom) also extends laterally in a closed path, along the boundary of the IC memory region M, to completely enclose the memory region M. At the IC logic region L, multiple logic devices 106 are spaced along the boundary of the IC boundary region B. For ease of illustration, only some of the multiple logic devices 106 are labeled 106. The multiple logic devices 106 may, for example, be spaced along the boundary of the IC boundary region B in a ring-shaped pattern. The ring-shaped pattern may be circular ring-shaped, square ring-shaped, rectangular ring-shaped, or some other suitable ring-shaped pattern.

With reference to FIGS. 4-39, a series of cross-sectional views 400-3900 illustrate some embodiments of a method for forming an IC comprising a boundary structure separating a memory cell and a logic device is provided. The IC may, for example, be the IC of any one of FIG. 1A, 1B, 2A, or 2B.

As illustrated by the cross-sectional view 400 of FIG. 4, a first lower pad layer 402, a first upper pad layer 404, and a protective layer 406 are formed stacked on a semiconductor substrate 108, at an IC memory region M, an IC boundary region B, and an IC logic region L. The semiconductor substrate 108 may be or comprise, for example, a bulk silicon substrate, a group III-V substrate, a SOI substrate, or some other suitable semiconductor substrate. The first lower pad layer 402 and the protective layer 406 are dielectric and may be or comprise, for example, silicon oxide, some other suitable dielectric(s), or any combination of the foregoing. The first upper pad layer 404 is dielectric and may be or comprise, for example, silicon nitride, some other suitable dielectric(s), or any combination of the foregoing. In some embodiments, the first lower pad layer 402 and the protective layer 406 are the same material, and the first upper pad layer 404 is a different material. For example the first lower pad layer 402 and the protective layer 406 may be or comprise silicon oxide or some other suitable dielectric, whereas the first upper pad layer 404 may be or comprise silicon nitride or some other suitable dielectric. The first lower pad layer 402, the first upper pad layer 404, and the protective layer 406 may be formed by, for example, chemical vapor deposition (CVD), physical vapor deposition (PVD), thermal oxidation, atomic layer deposition (ALD), some other suitable oxidation or deposition process(es), or any combination of the foregoing. As used herein, a term (e.g., process) with a suffix of "(es)" may, for example, be singular or plural.

As illustrated by the cross-sectional view 500 of FIG. 5, the protective layer 406 and the first upper pad layer 404 are patterned to remove the protective layer 406 and the first upper pad layer 404 from: 1) the IC memory region M; and 2) a portion of the IC boundary region B neighboring the IC memory region M. The patterning may, for example, be performed by an etching process or some other suitable patterning process. In some embodiments, the etching process comprises forming a mask 502 on: 1) the IC logic region L; and 2) a portion of the IC boundary region B neighboring the IC logic region L. An etch is performed into the protective layer 406 and the first upper pad layer 404 with the mask 502 in place, and the mask 502 is subsequently removed. The mask 502 may be or comprise, for example, photoresist or some other suitable mask material. In some embodiments, the first lower pad layer 402 serves as an etch stop for the etch.

As illustrated by the cross-sectional view 600 of FIG. 6, an oxidation process is performed to partially consume the first lower pad layer 402 and the semiconductor substrate 108 where uncovered by the protective layer 406 and the first upper pad layer 404. The oxidation process recesses the semiconductor substrate 108 at the IC memory region M, such that a first top surface portion of the semiconductor substrate 108 at the IC memory region M is recessed below a second top surface portion of the semiconductor substrate 108 at the IC logic region L by a distance D. In some embodiments, the distance D is chosen as a difference between a target memory height for a memory cell being formed at the IC memory region M and a target logic height for a logic device being formed at the IC logic region L. As discussed below, this may, for example, enhance CMP loading at FIG. 34. The distance D may be, for example, about 10-1000 angstroms, about 10-500 angstroms, about 500-1000 angstroms, about 250-350 angstroms, or some other suitable recessing range(s). Further, the oxidation process forms a dummy oxide layer 602 on the IC memory region M and a portion the IC boundary region B uncovered by the protective layer 406 and the first upper pad layer 404. The oxidation process may be or comprise, for example, wet oxidation, some other suitable oxidation process(es), or any combination of the foregoing.

While FIG. 6 illustrates an oxidation process to recess the semiconductor substrate 108 at the IC memory region M, other processes may perform the recessing. For example, an etching process may be performed to recess the semiconductor substrate 108 at the IC memory region M. In some embodiments in which the etching process performs the recessing, the first upper pad layer 404 is used a mask and/or the etching process uses a dry etchant, a wet etchant, some other suitable etchant(s), or any combination of the foregoing. In some embodiments in which the etching process performs the recessing, the protective layer 406 is omitted, such that the protective layer 406 is not formed at FIG. 4. In some embodiments in which the etching process performs the recessing, the etching process described with regard to FIG. 5 and the etching process performing the recessing are one and the same, such that the first upper pad layer 404, the first lower pad layer 402, and the semiconductor substrate 108 are etched by the same etching process and/or are etched using the same mask (e.g., the mask 502 of FIG. 5).

As illustrated by the cross-sectional view 700 of FIG. 7, the protective layer 406 (see FIG. 6), the first upper pad layer 404 (see FIG. 6), the first lower pad layer 402 (see FIG. 6), and the dummy oxide layer 602 (see FIG. 6) are removed. In some embodiments, the protective layer 406 and the dummy oxide layer 602 are removed by one or more etching processes and/or some other suitable removal process(es). Further, in some embodiments, the protective layer 406 and the dummy oxide layer 602 are the same material and/or are removed at the same time by a first etching process or some other suitable removal process. The semiconductor substrate 108 and the first upper pad layer 404 may, for example, serve as etch stops during the first etching process. The first upper pad layer 404 is removed after the protective layer 406 is removed. In some embodiments, the first upper pad layer 404 is removed by a second etching process or some other suitable removal process. The second etching process may, for example, be or comprise a wet etching process, a dry etching process, or some other suitable etching process, and/or may, for example, use a wet etchant comprising phosphoric acid (e.g. $H_3PO_4$) or some other suitable etchant. The semiconductor substrate 108 and the first lower pad layer 402 may, for example, serve as etch stops during the second etching process. The first lower pad layer 402 is removed after the first upper pad layer 404 is removed. In some embodiments, the first lower pad layer 402 is removed by a third etching process or some other suitable removal process. The semiconductor substrate 108 may, for example, serve as an etch stop during the third etching process.

As illustrated by the cross-sectional view 800 of FIG. 8, a second lower pad layer 802 and a second upper pad layer 804 are formed stacked on the semiconductor substrate 108, at the IC memory region M, the IC boundary region B, and the IC logic region L. The second lower pad layer 802 is a different material than the second upper pad layer 804 and is a dielectric. The second lower pad layer 802 may be or comprise, for example, silicon oxide, some other suitable dielectric(s), or any combination of the foregoing. The second upper pad layer 804 is a dielectric and may be or comprise, for example, silicon nitride, some other suitable dielectric(s), or any combination of the foregoing. In some embodiments, the second lower pad layer 802 is or comprises silicon oxide or some other suitable dielectric, whereas the second upper pad layer 804 is or comprises silicon nitride or some other suitable dielectric. The second lower pad layer 802 and the second upper pad layer 804 may be formed by, for example, CVD, PVD, thermal oxidation, ALD, some other suitable oxidation or deposition process(es), or any combination of the foregoing.

As illustrated by the cross-sectional view 900 of FIG. 9, the second lower pad layer 802, the second upper pad layer 804, and the semiconductor substrate 108 are patterned. The patterning forms a memory isolation trench 902, a boundary isolation trench 904, and a logic isolation trench 906 respectively at the IC memory region M, the IC boundary region B, and the IC logic region L. The memory isolation trench 902 demarcates a region of the semiconductor substrate 108 for an individual memory cell under manufacture, and the logic isolation trench 906 demarcates a region of the semiconductor substrate 108 for an individual logic device under manufacture. The boundary isolation trench 904 separates the IC memory region M and the IC logic region L. The patterning may, for example, be performed by an etching process or some other suitable patterning process. In some embodiments, the etching process comprises forming a mask 908 with a layout of the memory, boundary, and logic isolation trenches 902-906. An etch is performed into the semiconductor substrate 108 with the mask 908 in place, and the mask 908 is subsequently removed. The mask 908 may be or comprise, for example, photoresist or some other suitable mask material.

Figure 10:
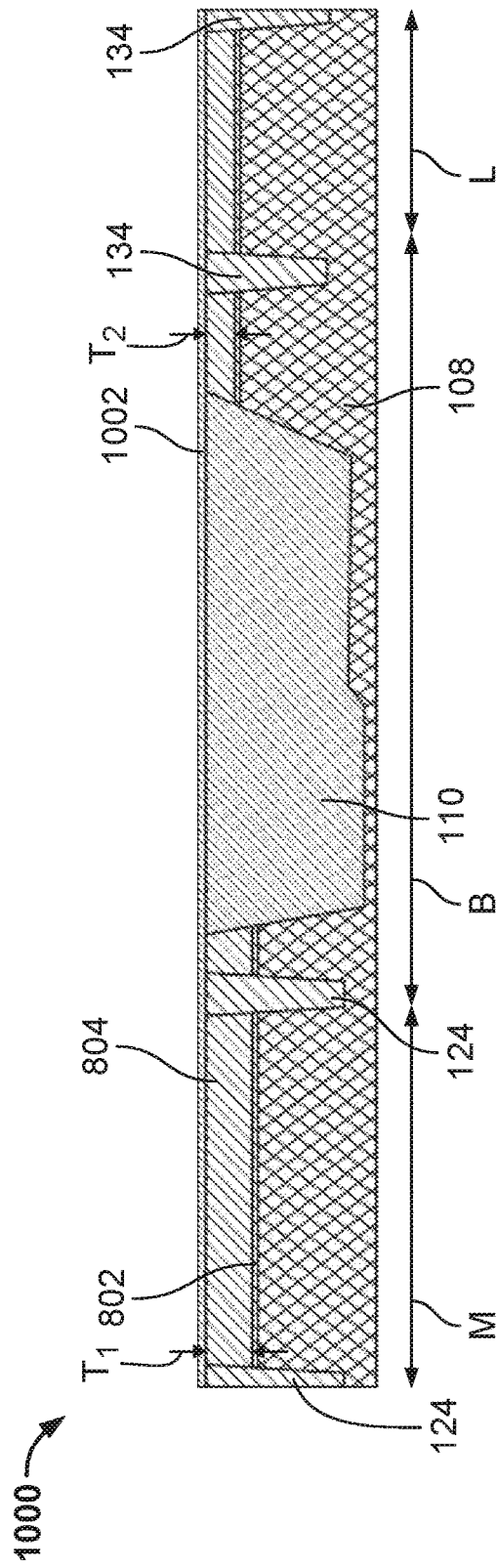

As illustrated by the cross-sectional view 1000 of FIG. 10, a memory isolation structure 124, a boundary isolation structure 110, and a logic isolation structure 134 are respectively formed in the memory, boundary, and logic isolation trenches 902-906 (see FIG. 9). The memory, boundary, and logic isolation structures 124, 110, 134 comprise a dielectric material, and may be or comprise, for example, a STI structure, a DTI structure, or some other suitable isolation structure. The dielectric material may be or comprise, for example, silicon oxide, some other suitable dielectric material(s), or any combination of the foregoing.

In some embodiments, the memory, boundary, and logic isolation structures 124, 110, 134 are formed by depositing a dielectric layer covering the structure of FIG. 9, and further filling the memory, boundary, and logic isolation trenches 902-906. Subsequently, a planarization is performed into the dielectric layer and the second upper pad layer 804 until a top surface of the dielectric layer is about even with a top surface of the second upper pad layer 804, thereby forming the memory, boundary, and logic isolation structures 124, 110, 134 from the dielectric layer. Due to the recessing at FIG. 6, the second upper pad layer 804 is recessed at the IC memory region M and the planarization removes more of the second upper pad layer 804 at the IC logic region L than at the IC memory region M. As a result, the second upper pad layer 804 has a first thickness $T_1$ at the IC memory region M and a second thickness $T_2$ less than the first thickness $T_1$ at the IC logic region L upon completion of the planarization. The planarization may, for example, be performed by a CMP or some other suitable planarization process.

Also illustrated by the cross-sectional view 1000 of FIG. 10, a logic capping layer 1002 is formed covering the memory, boundary, and logic isolation trenches 902-906, and further covering the second upper pad layer 804. The logic capping layer 1002 is dielectric and may be, for example, silicon oxide, some other suitable dielectric(s), or any combination of the foregoing. Further, the logic capping layer 1002 may be formed by, for example, CVD, PVD, ALD, some other suitable deposition process(es), or any combination of the foregoing.

Figure 11:
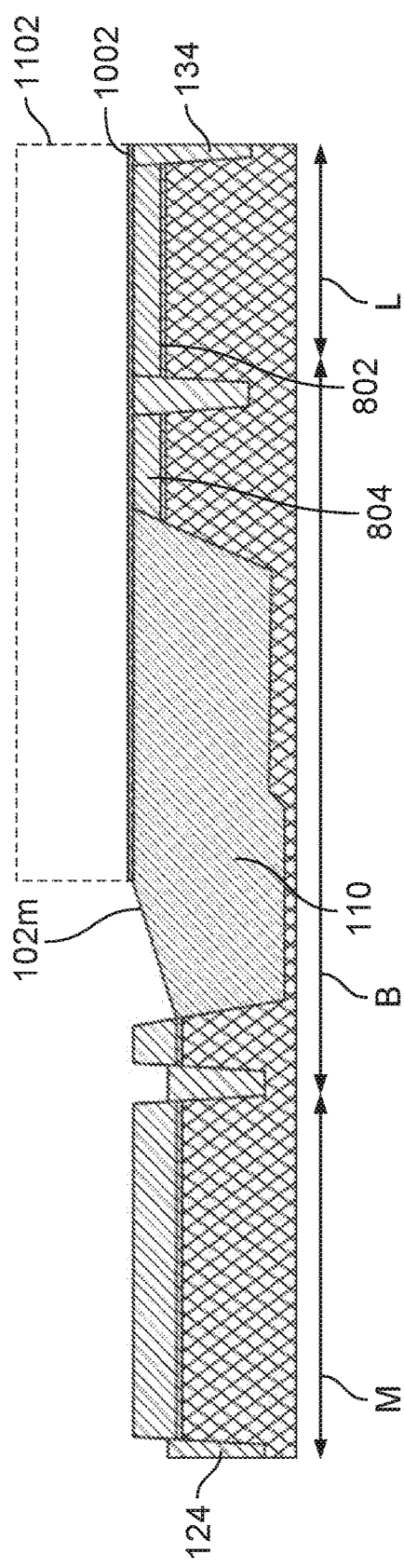

As illustrated by the cross-sectional view 1100 of FIG. 11, the logic capping layer 1002 is patterned to remove the logic capping layer 1002 from: 1) the IC memory region M; and 2) a portion of the boundary isolation structure 110 neighboring the IC memory region M. Further, after the removal, the boundary isolation structure 110 and the memory isolation structure 124 are recessed where uncovered by the logic capping layer 1002. The recessing of the boundary isolation structure 110 defines a memory-facing boundary sidewall 102*m* facing and slanting downwards towards the IC memory region M. In some embodiments, the memory-facing boundary sidewall 102*m* is smooth from top to bottom and, in some embodiments, arcs continuously from top to bottom.

The patterning and the recessing may, for example, be performed by an etching process or some other suitable patterning/recessing process. In some embodiments, the etching process comprises forming a mask 1102 covering: 1) the IC logic region L; and 2) a portion of boundary isolation structure 110 neighboring the IC logic region L. An etch is performed into the logic capping layer 1002, the boundary isolation structure 110, and the memory isolation structure 124 with the mask 1102 in place, and the mask 1102 is subsequently removed. The mask 1102 may be or comprise, for example, photoresist or some other suitable mask material. In some embodiments, the logic capping layer 1002, the boundary isolation structure 110, and the memory isolation structure 124 are or comprise the same material, and the second upper pad layer 804 is a different material. Further, in some embodiments, the etch minimally etches the second upper pad layer 804, relative to the logic capping layer 1002, the boundary isolation structure 110, and the memory isolation structure 124, due to differences in material.

As illustrated by the cross-sectional view 1200 of FIG. 12, the second upper pad layer 804 is removed from the IC memory region M. In some embodiments, the second upper pad layer 804 may, for example, be removed by an etching process or some other suitable removal process. The etching process may, for example, be or comprise a wet etching process, a dry etching process, or some other suitable etching process, and/or may, for example, use a wet etchant comprising phosphoric acid (e.g. $H_3PO_4$) or some other suitable etchant. The logic capping layer 1002, the boundary isolation structure 110, the memory isolation structure 124, and the second lower pad layer 802 may, for example, serve as etch stops for the etching process, and the logic capping layer 1002 may, for example, also protect the second upper pad layer 804 from removal at the IC logic region L.

As illustrated by the cross-sectional view 1300 of FIG. 13, a memory well 206 is formed at the IC memory region M, overlying a bulk semiconductor region 108b of the semiconductor substrate 108. In some embodiments, the memory well 206 has a different doping type or concentration as the bulk semiconductor region 108b. For example, the memory well 206 may be p-type, whereas the bulk semiconductor region 108b may be n-type, or vice versa. The memory well 206 may, for example, be formed by an ion implantation process or some other suitable doping process. The ion implantation process may, for example, comprise forming a mask 1302 covering the IC boundary region B and the IC logic region L. Ion implantation may be performed with the mask 1302 in place, and the mask 1302 may be subsequently removed. The mask 1302 may be or comprise, for example, photoresist or some other suitable mask material. Note that the ion implantation may, for example, be performed with the second lower pad layer 802 in place by selecting an implant energy sufficiently high for ions of the ion implantation to pass through the second lower pad layer 802.

As illustrated by the cross-sectional view 1400 of FIG. 14, the second lower pad layer 802 (see FIG. 13) is removed from the IC memory region M, and the logic capping layer 1002 (see FIG. 13) is removed from the IC boundary region B and the IC logic region L. The removal may, for example, be performed by an etching process or some other suitable removal process. In some embodiments, the second upper pad layer 804 and the semiconductor substrate 108 serve as etch stops for the etch.

As illustrated by the cross-sectional view 1500 of FIG. 15, an interfacial layer 204 is formed at the IC memory region M. The interfacial layer 204 is a dielectric and may be or comprise, for example, silicon oxide, a non-ferroelectric high κ dielectric, some other suitable dielectric(s), or any combination of the foregoing. Further, the interfacial layer 204 may, for example, be formed by CVD, PVD, ALD, thermal oxidation, some other suitable oxidation and/or deposition process(es), or any combination of the foregoing. In embodiments in which the interfacial layer 204 is formed by thermal oxidation, the interfacial layer 204 may be localized to the IC memory region M. Namely, oxide of the thermal oxidation may readily form on exposed semiconductor material at the IC memory region M (see FIG. 14) but may not form (or minimally form) on material of the boundary isolation structure 110 and material of the second upper pad layer 804.

Also illustrated by the cross-sectional view 1500 of FIG. 15, a data storage layer 1502, a data capping layer 1504, a dummy memory gate layer 1506, and a memory hard mask layer 1508 are formed stacked over the interfacial layer 204, at the IC memory region M, the IC boundary region B, and the IC logic region L. The data storage layer 1502, the data capping layer 1504, the dummy memory gate layer 1506, and the memory hard mask layer 1508 may, for example, be formed by CVD, PVD, ALD, electroless plating, electroplating, some other suitable plating and/or deposition process(es), or any combination of the foregoing.

The data storage layer 1502 is a material that may reversibly change between a first data state and a second data state so as to store a bit of data. In embodiments in which FeRAM is under manufacture at the IC memory region M, the data storage layer 1502 may be or comprise, for example, silicon doped hafnium oxide (e.g., $Si:HfO_2$), PZT, or some other suitable ferroelectric material. The data capping layer 1504 is conductive and, in some embodiments, is a diffusion barrier for metal gates hereafter formed. In some of these embodiments, the data capping layer 1504 may be or comprise, for example, titanium nitride, tantalum nitride, some other suitable diffusion barrier material, or any combination of the foregoing. In some embodiments in which the data storage layer 1502 comprises oxygen, the data capping layer 1504 has a low reactivity with oxygen. Such a low reactivity may, for example, be a reactivity that depends upon about 5-10 eV of energy, about 5-7 eV of energy, about 7-10 eV of energy, greater than about 5 eV of energy to react with oxygen, or some other amount of energy indicative of a low reactivity. In some of these embodiments, the data capping layer 1504 may be or comprise, for example, titanium nitride, tantalum nitride, platinum, iridium, tungsten, some other suitable material(s) with low oxygen reactivity, or any combination of the foregoing. The dummy memory gate layer 1506 may be or comprise, for example, polysilicon or some other suitable dummy material. The memory hard mask layer 1508 may be or comprise, for example, silicon oxide, silicon nitride, silicon oxynitride, some other suitable dielectric(s), or any combination of the foregoing. In some embodiments, the memory hard mask layer 1508 comprises a lower nitride layer (not shown) and an upper oxide layer (not shown) overlying the lower nitride layer.

As illustrated by the cross-sectional view 1600 of FIG. 16, the data storage layer 1502, the data capping layer 1504, the dummy memory gate layer 1506, and the memory hard mask layer 1508 are patterned to define a memory hard mask 1602, a dummy memory gate 1604, a data capping element 202, and a data storage element 120 stacked at the IC memory region M. The patterning may, for example, be performed by an etching process or some other suitable patterning process. The etching process may, for example, comprise forming a mask 1606 with a layout of the memory hard mask 1602. An etch may be performed into the data storage layer 1502, the data capping layer 1504, the dummy memory gate layer 1506, and the memory hard mask layer 1508 with the mask 1606 in place, and the mask 1606 may be subsequently removed. The mask 1606 may be or comprise, for example, photoresist or some other suitable mask material. In some embodiments, the interfacial layer 204 and the boundary isolation structure 110 serve as etch stops for the etch.

As illustrated by the cross-sectional view 1700 of FIG. 17, memory sidewall spacers 208 are formed on: 1) sidewalls of the dummy memory gate 1604; and 2) a sidewall of the dummy memory gate layer 1506 overlying the boundary isolation structure 110. The memory sidewall spacers 208 may, for example, be or comprise silicon nitride, silicon oxynitride, silicon oxide, some other suitable dielectric(s), or any combination of the foregoing. In some embodiments, a process for forming the memory sidewall spacers 208 comprises forming a memory sidewall spacer layer covering and lining the structure of FIG. 16, and subsequently performing an etch back into the memory sidewall spacer layer. The etch back removes horizontal segments of the memory sidewall spacer layer without removing vertical segments of the memory sidewall spacer layer, whereby the vertical segments correspond to the memory sidewall spacers 208. The memory sidewall spacer layer may, for example, be formed conformally, and/or may, for example, be formed by CVD, PVD, ALD, some other suitable deposition process(es), or any combination of the foregoing.

As illustrated by the cross-sectional view 1800 of FIG. 18, a memory etch stop layer 1802 is formed covering and lining the structure of FIG. 17. The memory etch stop layer 1802 may be or comprise, for example, silicon oxide, silicon nitride, some other suitable dielectric(s), or any combination of the foregoing. The memory etch stop layer 1802 may, for example, be formed conformally, and/or may, for example, be formed by CVD, PVD, ALD, some other suitable deposition process(es), or any combination of the foregoing.

Also illustrated by the cross-sectional view 1800 of FIG. 18, a memory capping layer 1804 is formed covering the memory etch stop layer 1802. Due to the recessing at FIG. 6, the memory capping layer 1804 is recessed at the IC memory region M. The memory capping layer 1804 may, for example, be or comprise silicon nitride, silicon oxynitride, some other suitable dielectric(s), polysilicon, aluminum copper, tantalum, some other suitable metal(s) or metal alloy(s), tantalum nitride, titanium nitride, some other suitable metal nitride(s), or some other suitable material(s). In some embodiments, the memory etch stop layer 1802 is or comprises silicon oxide or some other suitable dielectric, and the memory capping layer 1804 is or comprises polysilicon or some other suitable material. Further, the memory capping layer 1804 may, for example, be formed by CVD, PVD, ALD, some other suitable deposition process(es), or any combination of the foregoing.

As illustrated by the cross-sectional view 1900 of FIG. 19, a planarization is performed into the memory capping layer 1804 to flatten a top surface 1804*t* of the memory capping layer 1804. The planarization may, for example, be performed by a CMP or some other suitable planarization process. Because the memory capping layer 1804 is recessed at the IC memory region M (see FIG. 18), the top surface 1804*t* of the memory capping layer 1804 is slanted downward from the IC logic region L to the IC memory region M.

As illustrated by the cross-sectional view 2000 of FIG. 20, the memory capping layer 1804 and the memory etch stop layer 1802 are patterned to remove the memory capping layer 1804 and the memory etch stop layer 1802 from: 1) the IC logic region L; and 2) a portion of the boundary isolation structure 110 neighboring the IC logic region L. Further, the data storage layer 1502 (see FIG. 19), the data capping layer 1504 (see FIG. 19), the dummy memory gate layer 1506 (see FIG. 19), and the memory hard mask layer 1508 (see FIG. 19) are removed from the IC logic region L and the IC boundary region B, along with one of the memory sidewall spacers 208 (see FIG. 19) at the IC boundary region B. The patterning and the removal defines a logic-facing boundary sidewall 102*l*. The logic-facing boundary sidewall 102*l* faces the IC logic region L and is slanted downward towards the IC logic region L. In some embodiments, the logic-facing boundary sidewall 102*l* is smooth from top to bottom and/or arcs continuously from top to bottom. Further, in some embodiments, the logic-facing boundary sidewall 102*l* has a line-shaped cross-sectional profile.

In some embodiments, an angle θ of the logic-facing boundary sidewall 102*l* is between about 15-75 degrees, about 15-40 degrees, about 40-75 degrees, or some other suitable range. Other values for the angle θ are, however, amenable. If the angle θ is too small (e.g., less than about 15 degrees or some other value), the upper dummy memory layer 112*u* formed hereafter at FIG. 28 may be too large, whereby chip area may be wasted. If the angle θ is too large (e.g., greater than about 75 degrees or some other value), high κ dielectric material of the upper logic dielectric layer 2402 may not be affectively removed from the logic-facing boundary sidewall 102*l* at FIG. 26. In some embodiments, the angle θ is determined by trial and error. For example, the patterning of FIG. 26 may be performed with different angles θ for the logic-facing boundary sidewall 102*l*, and imaging may be used to determine which angles θ result in affective removal of the high κ dielectric material. The imaging may, for example, be performed using a SEM, a TEM, or some other suitable microscope or imaging device.

The logic-facing boundary sidewall 102*l* is formed extending towards the IC logic region L and ending a distance Y from a neighboring edge of the boundary isolation structure 110. The distance Y may, for example, be about 0.5-4.0 micrometers, about 0.5-2.25 micrometers, about 2.25-4.0 micrometers, or some other value or range of values. Further, a beginning of the logic-facing boundary sidewall 102*l* is laterally separated from an end of the logic-facing boundary sidewall 102*l* by a distance Z. The distance Z may, for example, be defined by the angle θ and a height H of the memory capping layer 1804 upon completion of the patterning at FIG. 20. For example, by trigonometry, the distance Z may be the quotient from dividing the height H by the tangent of the angle θ (e.g., $Z=H/\tan(\theta)$).

The patterning and the removal may, for example, be performed by an etching process or some other pattern/removal process. The etching process may, for example, be performed by forming a mask 2002 covering: 1) the IC memory region M; and 2) a portion of the boundary isolation structure 110 neighboring the IC memory region M. An etch may be performed with the mask 2002 in place, and the mask 2002 may be subsequently removed. The mask 2002 may be or comprise, for example, photoresist or some other suitable mask material. In some embodiments, the etch results in undercutting under the mask 2002. In some embodiments, the etch is performed by a dry etch or some other suitable etch. In some embodiments, the dry etch comprises: 1) applying plasma generated from a biased etch gas to the memory capping layer 1804 to thin down the memory capping layer 1804; 2) applying plasma generated from a polymer-like or polymer-rich gas to the memory capping layer 1804 to create the logic-facing boundary sidewall 102*l*; 3) applying plasma generated from a polymer-free gas to the memory capping layer 1804 to remove remaining material of the memory capping layer 1804 on the IC logic region L; and 4) applying plasma generated from an ion gas (e.g., argon or some other inert gas) to smooth the logic-facing boundary sidewall 102*l*.

As illustrated by the cross-sectional view 2100 of FIG. 21, portions respectively of the boundary isolation structure 110 and the logic isolation structure 134 uncovered by the memory capping layer 1804 are recessed. In some embodiments, the recessing may, for example, round or curve a bottom portion of the logic-facing boundary sidewall 102*l*. The recessing may, for example, be performed by an etching process or some other suitable removal/recess process. The etching process may, for example, be or comprise a wet etching process, a dry etching process, or some other suitable etching process, and/or may, for example, use a wet etchant comprising hydrofluoric acid (HF) or some other suitable chemical.

As illustrated by the cross-sectional view 2200 of FIG. 22, the second upper pad layer 804 (see FIG. 21) is removed from the IC logic region L. In some embodiments, the second upper pad layer 804 may, for example, be removed by an etching process or some other suitable removal process. The etching process may, for example, be or comprise a wet etching process, a dry etching process, or some other suitable etching process, and/or may, for example, use a wet etchant comprising phosphoric acid (e.g. $H_3PO_4$) or some other suitable etchant. The memory capping layer 1804, the boundary isolation structure 110, and the second lower pad layer 802 may, for example, serve as etch stops for the etch, and the memory capping layer 1804 may, for example, also protect structure at the IC memory region M during the etch.

As should be appreciated, the second lower and upper pad layers 802, 804 (see FIG. 20) served as a cap film to protect the IC logic region L while forming the memory cell structure at the IC memory region M. Absent the second lower and upper pad layers 802, 804, a logic device hereafter formed at the IC logic region L would be subject to a performance shift, which may negatively impact bulk manufacturing yields. For example, the process at FIGS. 13-17 may unintentionally introduce dopants into the semiconductor substrate 108 at the IC logic region L. These dopants may negatively affect the doping profile of the logic device, thereby shifting performance parameters of the logic device and/or rendering the logic device inoperable. Accordingly, the second lower and upper pad layers 802, 804 prevent the logic device hereafter formed at the IC logic region L from undergoing a performance shift and may increase bulk manufacturing yields.

As illustrated by the cross-sectional view 2300 of FIG. 2300, a logic well 212 is formed at the IC logic region L, overlying the bulk semiconductor region 108*b*. In some embodiments, the logic well 212 has a different doping type or concentration as the bulk semiconductor region 108*b*. For example, the logic well 212 may be p-type, whereas the bulk semiconductor region 108*b* may be n-type, or vice versa. The logic well 212 may, for example, be formed by an ion implantation process or some other suitable doping process. The ion implantation process may, for example, comprise forming a mask 2302 covering the IC boundary region B and the IC memory region M. Ion implantation may be performed with the mask 2302 in place, and the mask 2302 may be subsequently removed. The mask 2302 may be or comprise, for example, photoresist or some other suitable mask material. Note that the ion implantation may, for example, be performed with the second lower pad layer 802 in place by selecting an implant energy sufficiently high for ions of the ion implantation to pass through the second lower pad layer 802.

As illustrated by the cross-sectional view 2400 of FIG. 24, the second lower pad layer 802 (see FIG. 23) is removed from the IC logic region L. The removal may, for example, be performed by an etching process or some other suitable removal process. The etching process may, for example, be or comprise a wet etching process, a dry etching process, or some other suitable etching process, and/or may, for example, use a wet etchant comprising hydrofluoric acid (HF) or some other suitable chemical. Further, the etching process may, for example, be performed as part of a cleaning process or some other process.

Also illustrated by the cross-sectional view 2400 of FIG. 24, a lower logic dielectric layer 210, an upper logic dielectric layer 2402, a dummy logic gate layer 2404, and a logic hard mask layer 2406 are formed stacked at the IC memory region M, the IC boundary region B, and the IC logic region L. The lower logic dielectric layer 210 may be or comprise, for example, silicon oxide, some other suitable dielectric(s), or any combination of the foregoing. The upper logic dielectric layer 2402 may be or comprise, for example, silicon oxide, a high κ dielectric, some other suitable dielectric(s), or any combination of the foregoing. In some embodiments, the upper logic gate dielectric layer 2402 comprises a silicon oxide layer (not shown) and a high κ dielectric layer (not shown) overlying the silicon oxide layer. The dummy logic gate layer 2404 may be or comprise, for example, polysilicon or some other suitable dummy material. The logic hard mask layer 2406 may be or comprise, for example, silicon oxide, silicon nitride, silicon oxynitride, some other suitable dielectric(s), or any combination of the foregoing. In some embodiments, the logic hard mask layer 2406 comprises a lower nitride layer (not shown) and an upper oxide layer (not shown) overlying the lower nitride layer.

The lower logic dielectric layer 210, the upper logic dielectric layer 2402, the dummy logic gate layer 2404, and the logic hard mask layer 2406 may, for example, be formed by CVD, PVD, ALD, thermal oxidation, some other suitable deposition or oxidation process(es), or any combination of the foregoing. In some embodiments, the lower logic dielectric layer 210 is formed by oxidation, whereas the upper logic dielectric layer 2402, the dummy logic gate layer 2404, and the logic hard mask layer 2406 are formed by CVD, PVD, ALD, or some other suitable deposition processes. In embodiments in which the lower logic dielectric layer 210 is formed by oxidation, the thermal may be localized to the IC logic region L. Namely, oxide of the oxidation process may readily form on exposed semiconductor material at the IC logic region L, but may not form (or minimally form) on material of the boundary isolation structure 110.

As illustrated by the cross-sectional view 2500 of FIG. 25, the logic hard mask layer 2406 is patterned to remove a portion of the logic hard mask layer 2406 at: 1) the IC memory region M; and 2) a portion of the IC boundary region B neighboring the IC memory region M. Further, the dummy logic gate layer 2404 is recessed at: 1) the IC memory region M; and 2) the portion of the IC boundary region B neighboring the IC memory region M. As such, the dummy logic gate layer 2404 has a first thickness $T_1$ at the IC memory region M and a second thickness $T_2$ greater than the first thickness $T_1$ at the IC logic region L. The patterning and the recessing may, for example, be performed by an etching process or some other suitable patterning/recessing process. In some embodiments, the etching process comprises forming a mask 2502 on: 1) the IC logic region L; and 2) a portion of the IC boundary region B neighboring the IC logic region L. An etch is performed into the logic hard mask layer 2406 and the dummy logic gate layer 2404 with the mask 2502 in place, and the mask 2502 is subsequently removed. The mask 2502 may be or comprise, for example, photoresist or some other suitable mask material.

As illustrated by the cross-sectional view 2600 of FIG. 26, the upper logic dielectric layer 2402 (see FIG. 25), the dummy logic gate layer 2404 (see FIG. 25), and the logic hard mask layer 2406 (see FIG. 25) are patterned. The patterning defines a logic hard mask 2602, a dummy logic gate 2604, and a logic gate dielectric layer 130 stacked at the IC logic region M. The patterning also defines a lower dummy logic layer 114*l*, an upper dummy logic layer 114*u*, and a dummy hard mask 2606 stacked on the boundary isolation structure 110. The patterning may, for example, be performed by an etching process or some other suitable patterning process. The etching process may, for example, comprise forming a mask 2608 with a layout of the logic and dummy hard masks 2602, 2606. An etch may be performed into the upper logic dielectric layer 2402, the dummy logic gate layer 2404, and the logic hard mask layer 2406 with the mask 2608 in place, and the mask 2608 may be subsequently removed. The mask 2608 may be or comprise, for example, photoresist or some other suitable mask material. In some embodiments, the memory capping layer 1804, the boundary isolation structure 110, the logic isolation structure 134, and the lower logic dielectric layer 210 serve as etch stops for the etching process.

By forming the logic-facing boundary sidewall 102*l* with a slanted and smooth profile, material of the upper logic dielectric layer 2402 may be fully removed from the logic-facing boundary sidewall 102*l* while patterning the upper logic dielectric layer 2402 into the logic gate dielectric layer 130. Where the upper logic dielectric layer 2402 comprises a high κ dielectric material, residual high κ dielectric material on the logic-facing boundary sidewall 102*l* may diffuse or otherwise move into the semiconductor substrate 108, thereby changing doping profiles of semiconductor devices on the semiconductor substrate 108. The change in doping profiles may, in turn, lead to shifts in operating parameters of the semiconductor devices and/or render the semiconductor devices inoperable. Further, the residual high κ dielectric material may contaminate process tools used hereafter and may negatively affect other ICs formed using the contaminated process tools in the same manner described above. Therefore, fully removing high κ dielectric material from the logic-facing boundary sidewall 102*l* may prevent changing doping profiles of semiconductor devices and/or contaminating process tools. This may, in turn, enhance bulk manufacturing yields.

As illustrated by the cross-sectional view 2700 of FIG. 27, logic sidewall spacers 214 are formed on: 1) sidewalls of the upper dummy logic layer 114*u*; and 2) sidewalls of the dummy logic gate 2604. The logic sidewall spacers 214 may, for example, be or comprise silicon nitride, silicon oxynitride, silicon oxide, some other suitable dielectric(s), or any combination of the foregoing. In some embodiments, a process for forming the logic sidewall spacers 214 comprises forming a logic sidewall spacer layer covering and lining the structure of FIG. 26, and subsequently performing an etch back into the logic sidewall spacer layer. The etch back removes horizontal segments of the logic sidewall spacer layer without removing vertical segments of the logic sidewall spacer layer, whereby the vertical segments correspond to the logic sidewall spacers 214. The logic sidewall spacer layer may, for example, be formed conformally, and/or may, for example, be formed by CVD, PVD, ALD, some other suitable deposition process(es), or any combination of the foregoing.

As illustrated by the cross-sectional view 2800 of FIG. 28, the memory capping layer 1804 (see FIG. 27) is patterned to remove the memory capping layer 1804 from the IC memory region M, while leaving a dummy segment of the memory capping layer 1804 on the boundary isolation structure 110. The remaining portion of the memory capping layer 1804 defines an upper dummy memory layer 112*u*. The patterning may, for example, be performed by an etching process or some other suitable patterning process. In some embodiments, the etching process comprises forming a mask 2802 on: 1) the IC logic region L; and 1) a portion of the IC boundary region B neighboring the IC logic region L. An etch is performed into the memory capping layer 1804 with the mask 2802 in place, and the mask 2802 is subsequently removed. The mask 2802 may be or comprise, for example, photoresist or some other suitable mask material.

In some embodiments, a beginning of the logic-facing boundary sidewall 102*l* is laterally offset from a first edge of the boundary isolation structure 110 by a distance X. The distance X may, for example, be about 0.5-3.0 micrometers, about 0.5-1.75 micrometers, about 1.75-3.0 micrometers, or some other value or range of values. In some embodiments, the logic-facing boundary sidewall 102*l* slants downward towards the dummy logic structure 114 and ends a distance Y from a second edge of the boundary isolation structure 110, where the second edge is on an opposite side of the boundary isolation structure 110 as the first edge of the boundary isolation structure 110. The distance Y may, for example, be about 0.5-4.0 micrometers, about 0.5-2.25 micrometers, about 2.25-4.0 micrometers, or some other value or range of values. In some embodiments, the beginning of the logic-facing boundary sidewall 102*l* and the end of the logic-facing boundary sidewall 102*l* are laterally separated by a distance Z. The distance Z may, for example, be about 0.1-3.0 micrometers, about 0.1-1.5 micrometers, about 1.5-3.0 micrometers, or some other value or range of values. In some embodiments, the boundary isolation structure 110 has a width equal to the sum of the distances X, Y, Z (e.g., X+Y+Z), and/or the sum of the distances X, Y, Z is between about 1-10 micrometers, about 1-5.5 micrometers, about 5.5-10 micrometers, or some other value or range of values.

Figure 34:
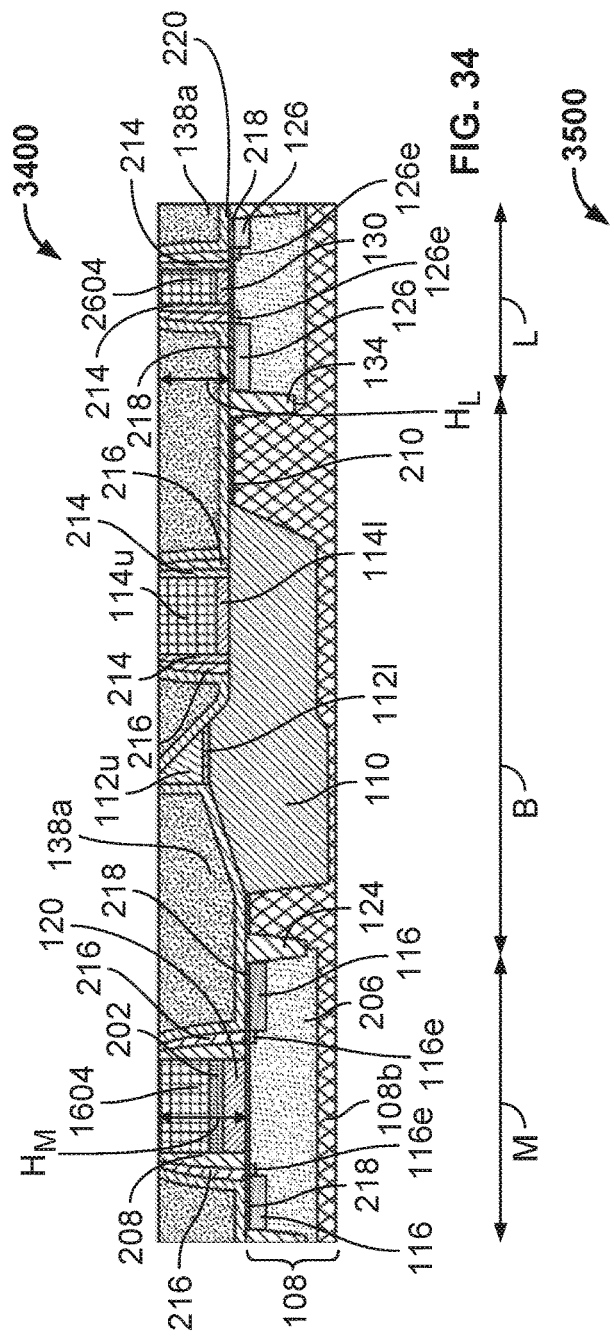

If the sum of the distances X, Y, Z is too large, chip area may be wasted. If the sum of the distances X, Y, Z is too small, the upper dummy memory layer 112*u* and/or the upper dummy logic layer 114*u* may be too small to affectively reduce dishing and/or erosion during the planarization discussed hereafter at FIG. 34. As described in detail hereafter, this may lead to non-uniform memory cells and/or non-uniform logic devices. In some embodiments, the distances X, Y, Z are determined by trial and error. For example, the IC of FIG. 34 is formed using different values for the distances X, Y, Z, and imaging is used to assess whether the dummy memory structure 112 and/or the dummy logic structure 114 affectively reduce dishing and/or erosion during the planarization at FIG. 34. The imaging may, for example, be performed using a SEM, a TEM, or some other suitable microscope or imaging device.

As illustrated by the cross-sectional view 2900 of FIG. 29, the memory etch stop layer 1802 (see FIG. 27) is patterned. The patterning removes a portion of the memory etch stop layer 1802 uncovered by upper dummy memory layer 112*u* and defines a lower dummy memory layer 112*l* underlying the upper dummy memory layer 112*u*. The patterning may, for example, be performed by an etching process or some other suitable removal process. The etching process may, for example, be or comprise a wet etching process, a dry etching process, or some other suitable etching process, and/or may, for example, use a wet etchant comprising hydrofluoric acid (HF) or some other suitable chemical. Further, the etching process may, for example, be performed as part of a cleaning process or some other process.

Also illustrated by the cross-sectional view 2900 of FIG. 29, a pair of memory source/drain extensions 116*e* and a pair of logic source/drain extensions 126*e* are respectively formed on the memory well 206 and the logic well 212. The memory source/drain extensions 116*e* are formed respectively on opposite sides of the dummy memory gate 1604 and have an opposite doping type as the memory well 206. The logic source/drain extensions 126*e* are respectively on opposite sides of the dummy logic gate 2604 and have an opposite doping type as the logic well 212. The memory and logic source/drain extensions 116*e*, 126*e* may, for example, be formed by one or more ion implantation processes or some other suitable doping process(es). For example, a first ion implantation process may be performed for p-type source/drain extensions, whereas a second ion implantation process may be performed for n-type source/drain extensions. An ion implantation process may, for example, comprise forming a mask 2902 with a layout of the source/drain extensions being formed. Ion implantation may be performed with the mask 2902 in place, and the mask 2902 may be subsequently removed. The mask 2902 may be or comprise, for example, photoresist or some other suitable mask material. Note that the ion implantation may, for example, be performed through a dielectric layer (e.g., the interfacial layer 204) by selecting an implant energy sufficiently high for ions of the ion implantation to pass through the dielectric layer.

As illustrated by the cross-sectional view 3000 of FIG. 30, additional sidewall spacers 216 are formed on sidewalls of the memory and logic sidewall spacers 208, 214. The additional sidewall spacers 216 may, for example, be or comprise silicon nitride, silicon oxynitride, silicon oxide, some other suitable dielectric(s), or any combination of the foregoing. In some embodiments, a process for forming the additional sidewall spacers 216 comprises forming a sidewall spacer layer covering and lining the structure of FIG. 29, and subsequently performing an etch back into the sidewall spacer layer. The etch back removes horizontal segments of the sidewall spacer layer without removing vertical segments of the sidewall spacer layer, whereby the vertical segments correspond to the additional sidewall spacers 216. The sidewall spacer layer may, for example, be formed conformally, and/or may, for example, be formed by CVD, PVD, ALD, some other suitable deposition process(es), or any combination of the foregoing.

As illustrated by the cross-sectional view 3100 of FIG. 3100, a pair of memory source/drain regions 116 and a pair of logic source/drain regions 126 are respectively formed on the memory well 206 and the logic well 212. The memory source/drain regions 116 respectively adjoin the memory source/drain extensions 116e, and the logic source/drain regions 126 respectively adjoin the logic source/drain extensions 126e. The memory source/drain regions 116 and the logic source/drain regions 126 may, for example, be formed by one or more ion implantation processes or some other suitable doping process(es). For example, a first ion implantation process may be performed for p-type source/drain regions, whereas a second ion implantation process may be performed for n-type source/drain regions. An ion implantation process may, for example, comprise forming a mask 3102 with a layout of the source/drain regions being formed. Ion implantation may be performed with the mask 3102 in place, and the mask 3102 may be subsequently removed. The mask 3102 may be or comprise, for example, photoresist or some other suitable mask material. Note that the ion implantation may, for example, be performed through a dielectric layer by selecting an implant energy sufficiently high for ions of the ion implantation to pass through the dielectric layer.

Figure 32:
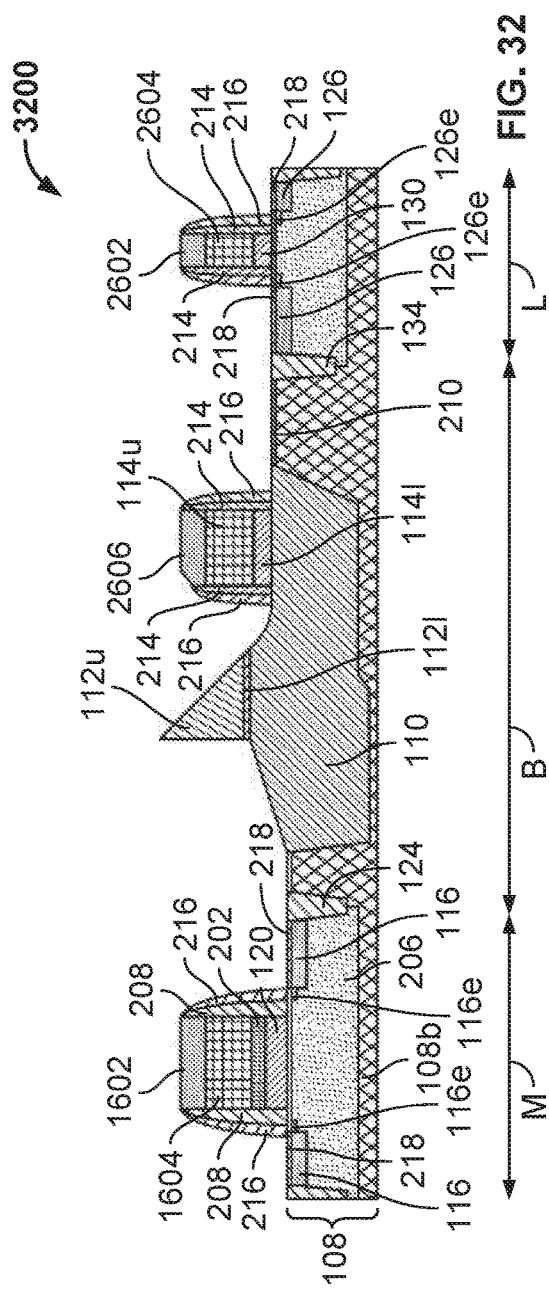

As illustrated by the cross-sectional view 3200 of FIG. 32, silicide pads 218 are formed on the memory and logic source/drain regions 116, 126. The silicide pads 218 may be or comprise, for example, nickel silicide, some other suitable silicide(s), or any combination of the foregoing. In some embodiments, a process for forming the silicide pads 218 comprises: 1) forming a protective dielectric layer covering and lining the structure of FIG. 31; 2) patterning the protective dielectric layer to expose the source/drains; 3) performing a salicide process with the protective dielectric layer in place; and 4) removing the protective dielectric layer. In some embodiments, the removing is performed by an etch or some other suitable removal process(es). The etch preferentially removes material of the protective dielectric layer relative to other material underlying and/or neighboring the protective dielectric layer.

Figure 33:
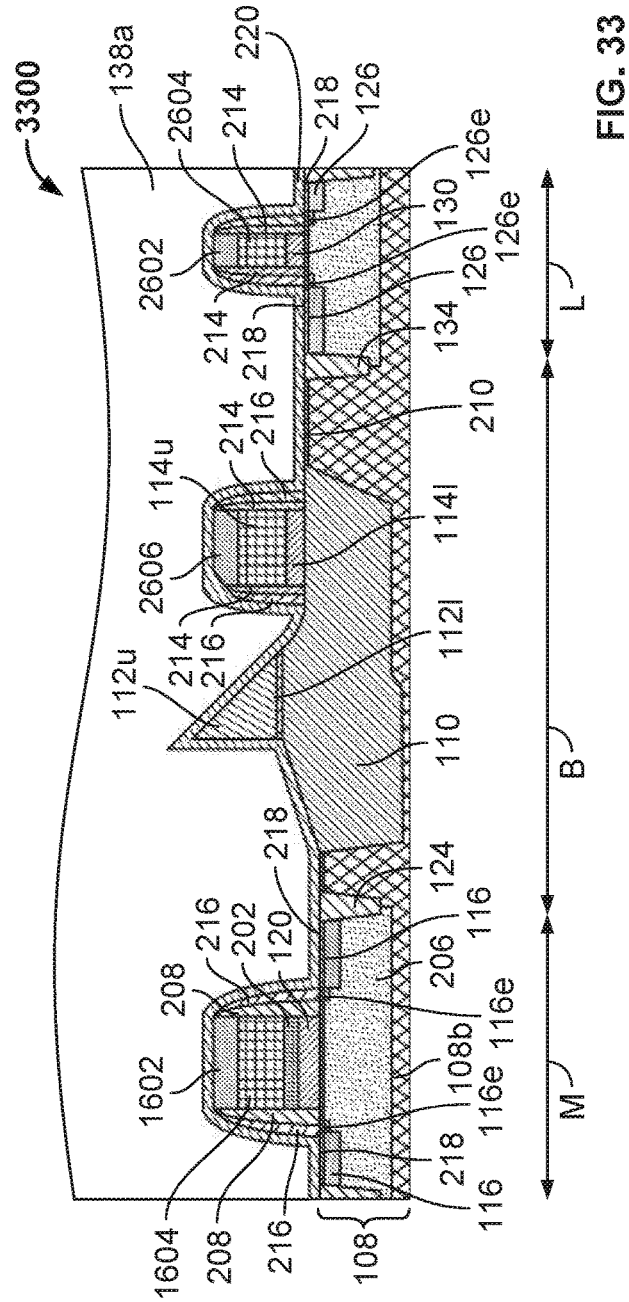

As illustrated by the cross-sectional view 3300 of FIG. 33, a contact etch stop layer 220 is formed covering and lining the structure of FIG. 32. The contact etch stop layer 220 may be or comprise, for example, silicon oxide, silicon nitride, some other suitable dielectric(s), or any combination of the foregoing. The contact etch stop layer 220 may, for example, be formed conformally, and/or may, for example, be formed by CVD, PVD, ALD, some other suitable deposition process(es), or any combination of the foregoing.

Also illustrated by the cross-sectional view 3300 of FIG. 33, a first ILD layer 138a is formed over the contact etch stop layer 220. The first ILD layer 138a may, for example, be silicon oxide, a low κ dielectric, some other suitable dielectric(s), or any combination of the foregoing. The first ILD layer 138a may, for example, be formed by CVD, PVD, ALD, sputtering, some other suitable deposition process(es), or any combination of the foregoing.

As illustrated by the cross-sectional view 3400 of FIG. 34, a planarization is performed into the first ILD layer 138a to coplanarize a top surface of the first ILD layer 138a with a top surface of the dummy memory gate 1604 and a top surface of the dummy logic gate 2604, thereby exposing the dummy memory gate 1604 and the dummy logic gate 2604. During the planarization, the memory hard mask 1602 (see FIG. 33) and the logic hard mask 2602 (see FIG. 33) are removed. The planarization may, for example, be performed by a CMP or some other suitable planarization process(es).

In embodiments in which the planarization is performed by CMP, the CMP is uniform and bulk manufacturing yields are high due to the recessing of the semiconductor substrate 108 at the IC memory region M (see FIG. 6). For example, the logic device structure at the IC logic region L may have a logic height $H_L$ and the memory cell structure at the IC memory region M may have a memory height $H_M$ greater than the logic height $H_L$. Therefore, without the recessing (e.g., by the distance D), a top surface of the memory cell structure may be substantially higher than a top surface of the logic device structure. As such, CMP loading may be higher at the IC memory region M, relative to the IC logic region L, and may cause the CMP to be slanted. The slanted CMP, in turn, leads non-uniform removal of the logic device structure and the memory cell structure, which may lead to semiconductor devices with non-uniform operating parameters and low bulk manufacture yields. Further, because of the height difference between the memory cell structure and the logic device structure, the memory cell structure may be substantially consumed by the CMP before the dummy logic gate 2604 is exposed. This, in turn, may destroy the memory cell structure and lead to low bulk manufacturing yields.

The upper and lower dummy memory layers 112u, 112l and the upper and lower dummy logic layers 114u, 114l define dummy structures on the boundary isolation structure 110. Due to the dummy structures, dishing and/or erosion during the planarization may be reduced in embodiments in which the planarization is performed by CMP. For example, without the dummy structures, the CMP may more quickly planarize the IC boundary region B relative to the IC memory and logic regions M, L since material to be removed at the IC boundary region B is softer than material to be removed at the IC memory and logic regions M, L. The faster removal at the IC boundary region B causes dishing at the IC boundary region B and non-uniform removal at the IC memory and logic regions M, L. This, in turn, leads to non-uniform memory cell structures and/or non-uniform logic device structures respectively at the IC memory region M and the IC logic region L, which may negatively impact bulk manufacturing yields. Accordingly, the dummy structures may reduce dishing and improve uniformity of semiconductor devices at the IC memory and logic regions M, L, thereby enhancing bulk manufacturing yields.

Figure 35:
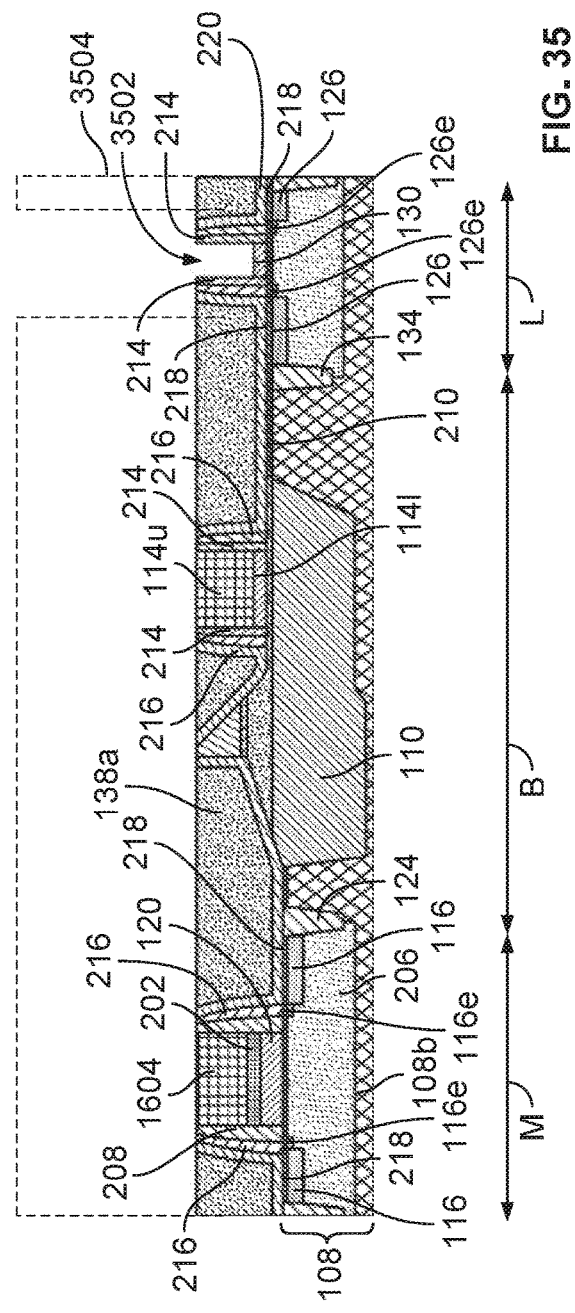

As illustrated by the cross-sectional view 3500 of FIG. 35, a first dummy gate is removed. The first dummy gate is a dummy gate that corresponds to a p-channel switching device and, in some embodiments, is the dummy logic gate 2604. As used herein, a switching device is a MOS device or some other semiconductor device that has a selectively-conductive channel configured to "switch" between a conducting state and a non-conducting state. The removal results in a first gate opening 3502 in place of the removed dummy gate. The removal may, for example, be performed by an etching process or some other suitable removal process. In some embodiments, the etching process comprises forming a mask 3504 with a layout of the first dummy gate. Subsequently, an etch is performed into the first dummy gate with the mask 3504 in place, and the mask 3504 is subsequently removed. The mask 3504 may be or comprise, for example, photoresist or some other suitable mask material.

As illustrated by the cross-sectional view 3600 of FIG. 36, a p-type metal layer 3602 is formed covering the structure of FIG. 35, and further filling the first gate opening 3502 (see FIG. 35). The p-type metal layer 3602 is or comprises metal with an p-type work function and may be or comprise, for example, ruthenium, palladium, platinum, cobalt, nickel, titanium aluminum nitride, tungsten carbon nitride, some other suitable p-type work function metal(s), or any combination of the foregoing. The p-type metal layer 3602 may be formed by, for example, by CVD, PVD, electroless plating, electroplating, some other suitable growth or deposition process(es), or any combination of the foregoing.

As illustrated by the cross-sectional view 3700 of FIG. 37, a planarization is performed into the p-type metal layer 3602 (see FIG. 36) to form a p-type metal gate electrode. In some embodiments, the p-type metal gate electrode is a logic gate electrode 132 at the IC logic region L. In some embodiments, the planarization extends into the first ILD layer 138a to ensure complete removal of unused metal of the p-type metal layer 3602. The planarization may, for example, be performed by a CMP or some other suitable planarization process(es). As with the planarization at FIG. 34, the dummy structures defined by the upper and lower dummy memory layers 112u, 112l and the upper and lower dummy logic layers 114u, 114l may promote a more uniform planarization of the IC boundary, memory, and logic regions B, M, L.

Figure 38:
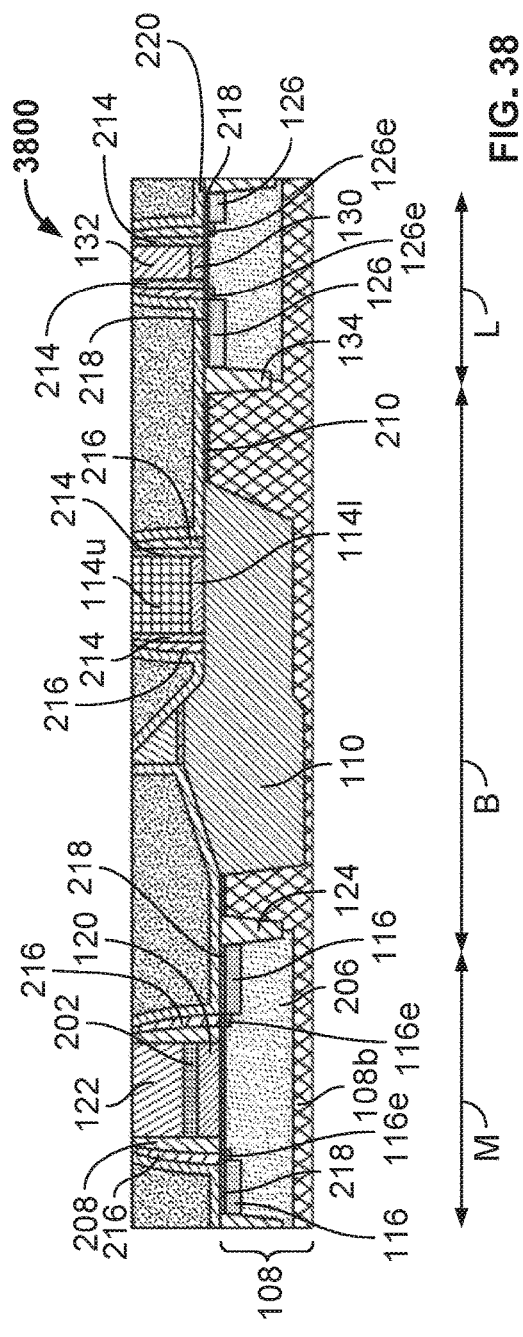

As illustrated by the cross-sectional view 3800 of FIG. 38, the process at FIGS. 35-37 is repeated for n-channel switching devices, whereby a second dummy gate is replaced by an n-type metal gate electrode. The n-type metal gate electrode is or comprises metal with an n-type work function and may be or comprise, for example, hafnium, zirconium, titanium, tantalum, aluminum, some other suitable n-type work function metal(s), or any combination of the foregoing. In some embodiments, the n-type metal gate electrode is a memory gate electrode 122 at the IC memory region M.

Figure 39:
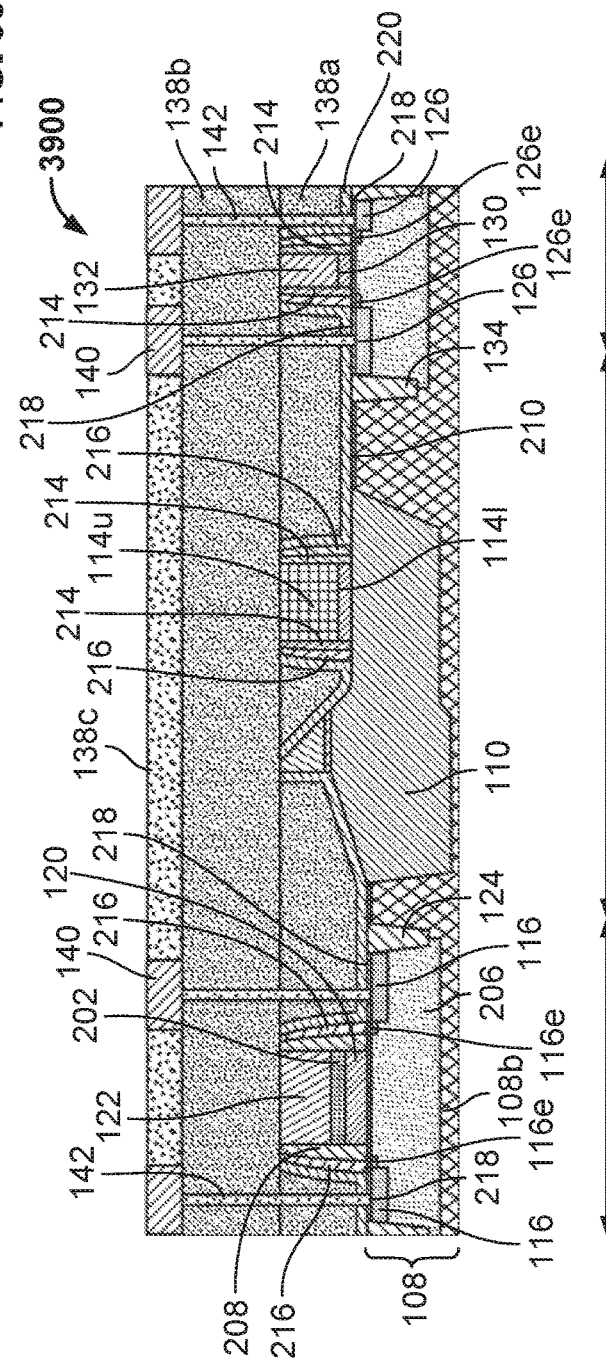

As illustrated by the cross-sectional view 3900 of FIG. 39, a second ILD layer 138b is formed covering the structure of FIG. 38 and with a top surface that is planar or substantially planar. The second ILD layer 138b may be or comprise, for example, oxide, a low κ dielectric, some other suitable dielectric(s), or any combination of the foregoing. Further, the second ILD layer 138b may, for example, be formed by depositing the second ILD layer 138b, and subsequently performing a planarization into the top surface of the second ILD layer 138b.

Also illustrated by the cross-sectional view 3900 of FIG. 39, contact vias 142 are formed extending through the first and second ILD layers 138a, 138b to the silicide pads 218. The contact vias 142 may, for example, be copper, tungsten, aluminum copper, some other suitable conductive material, or any combination of the foregoing. The contact vias 142 may, for example, be formed by patterning the first and second ILD layers 138a, 138b to define a plurality of contact via openings with a layout of the contact vias 142, and subsequently filling the contact via openings with a conductive material.

Also illustrated by the cross-sectional view 3900 of FIG. 39, an IMD layer 138c is formed overlying the second ILD layer 138b, and wires 140 are formed recessed into the IMD layer 138c and respectively overlying the contact vias 142. The IMD layer 138c may be or comprise, for example, oxide, a low κ dielectric, some other suitable dielectric(s), or any combination of the foregoing. The contact vias 142 may, for example, be copper, aluminum copper, some other suitable conductive material, or any combination of the foregoing. In some embodiments, a process for forming the IMD layer 138c and the wires 140 comprises patterning the IMD layer 138c to define a plurality of wire openings with a layout of the wires 140, and subsequently filling the wire openings with a conductive material.

While Figs. FIGS. 35-38 illustrate the dummy logic gate 2604 as corresponding to a p-channel switching device and the dummy memory gate 1604 as corresponding to an n-channel switching device, it is to be appreciated that the dummy logic gate 2604 may correspond to a n-channel switching device and the dummy memory gate 1604 may correspond to an p-channel switching device in other embodiments. Further, in other embodiments, the dummy logic gate 2604 and the dummy memory gate 1604 may correspond to switching devices have the same channel type in other embodiments. For example, the dummy logic gate 2604 and the dummy memory gate 1604 may correspond to two switching devices each having an n-channel. As another example, the dummy logic gate 2604 and the dummy memory gate 1604 may correspond to two switching devices each having a p-channel.

Figure 40A:
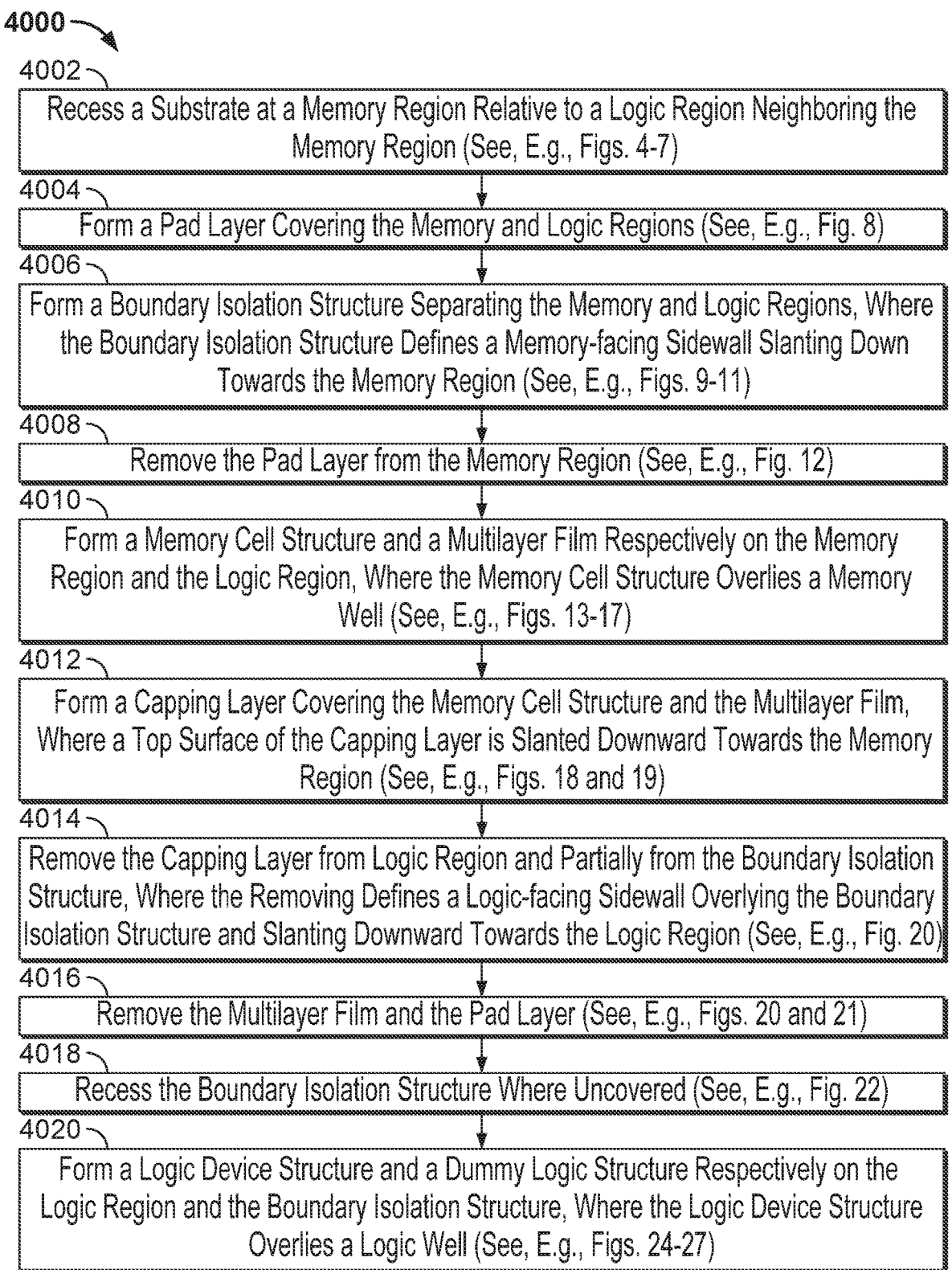
FIGS. 40A and 40B illustrate a flowchart of some embodiments of the method of FIGS. 4-39.
Figure 40B:
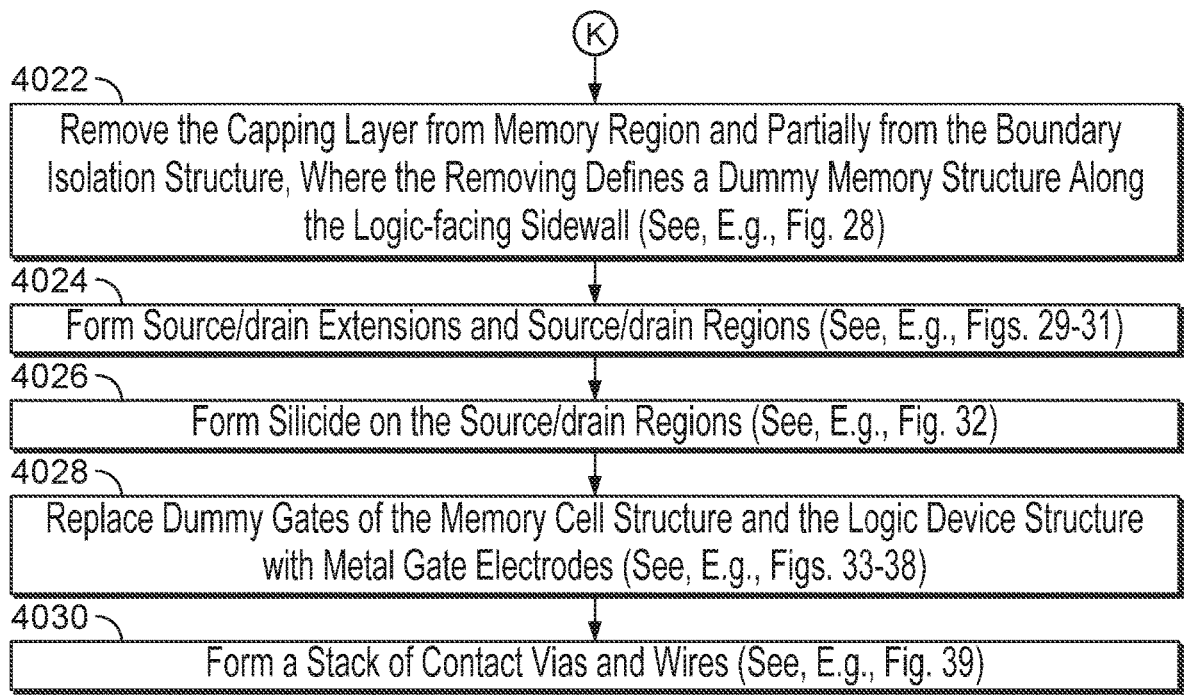

With reference to FIGS. 40A, and 40B, a flowchart 4000 of some embodiments of a method for forming an IC comprising a boundary structure separating a memory cell and a logic device is provided. The method may, for example, correspond to the method of FIGS. 4-39.

At 4002, a substrate is recessed at a memory region relative to a logic region neighboring the memory region. See, for example, FIGS. 4-7.

At 4004, a pad layer is formed covering the memory and logic regions. See, for example, FIG. 8.

At 4006, a boundary isolation structure is formed separating the memory and logic regions, where the boundary isolation structure defines a memory-facing sidewall slanting down towards the memory region. See, for example, FIGS. 9-11.

At 4008, the pad layer is removed from the memory region. See, for example, FIG. 12.

At 4010, a memory cell structure and a multilayer film are formed respectively on the memory region and the logic region, where the memory cell structure overlies a memory well. See, for example, FIGS. 13-17.

At 4012, a capping layer is formed covering the memory cell structure and the multilayer film, where a top surface of the capping layer is slanted downward towards the memory region. See, for example, FIGS. 18 and 19.

At 4014, the capping layer is removed from logic region and partially from the boundary isolation structure, where the removing defines a logic-facing sidewall overlying the boundary isolation structure and slanting downward towards the logic region. See, for example, FIG. 20.

At 4016, the multilayer film and the pad layer are removed. See, for example, FIGS. 20 and 21.

At 4018, the boundary isolation structure is recessed where uncovered. See, for example, FIG. 22.

At 4020, a logic device structure and a dummy logic structure are formed respectively on the logic region and the boundary isolation structure, where the logic device structure overlies a logic well. See, for example, FIGS. 24-27. Step 4020 of FIG. 40A is continued to step 4022 of FIG. 40B by a node K.

At 4022, the capping layer is removed from memory region and partially from the boundary isolation structure, where the removing defines a dummy memory structure along the logic-facing sidewall. See, for example, FIG. 28.

At 4024, source/drain extensions and source/drain regions are formed. See, for example, FIGS. 29-31.

At 4026, silicide is formed on the source/drain regions. See, for example, FIG. 32.

At 4028, dummy gates of the memory cell structure and the logic device structure are replaced with metal gate electrodes. See, for example, FIGS. 33-38.

At 4030, a stack of contact vias and wires are formed. See, for example, FIG. 39.

While the flowchart 4000 of FIG. 40A and 40B is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a method for forming an IC, the method including: forming an isolation structure separating a memory region of a substrate from a logic region of the substrate; forming a multilayer film covering the memory region, the logic region, and the isolation structure; performing a first etch into the multilayer film to form a memory cell structure on the memory region and to remove the multilayer film from a portion of the isolation structure; forming a capping layer covering the memory cell structure, a remainder of the multilayer film on the logic region, and the isolation structure; performing a second etch into the capping layer to remove the capping layer from the logic region, wherein the second etch forms a logic sidewall on the portion of isolation structure, and wherein the logic sidewall is slanted downward towards the logic region; and forming a logic device structure on the logic region with the capping layer in place. In some embodiments, the method further includes performing a third etch into the capping layer to remove the capping layer from the memory region, while leaving a dummy segment of the capping layer on the portion of the isolation structure, wherein the dummy segment defines the logic sidewall. In some embodiments, the forming of the logic device structure includes: forming a high κ dielectric layer covering the capping layer and the logic region, and further lining the logic sidewall; forming a dummy gate layer covering and lining the high κ dielectric layer; and performing a third etch into the high κ dielectric layer and the dummy gate layer to form a dummy gate and a high κ gate dielectric layer stacked on the logic region, wherein the third etch removes the high κ dielectric layer from the logic sidewall. In some embodiments, the method further includes replacing the dummy gate with a metal gate electrode. In some embodiments, the third etch further defines a dummy logic structure on the isolation structure, laterally spaced between the logic sidewall and the logic device structure. In some embodiments, the method further includes recessing the memory region relative to the logic region, wherein the isolation structure is formed after the recessing. In some embodiments, the recessing includes: forming a mask covering the logic region, but not the memory region; performing an oxidation process to oxidize the memory region with the mask in place, wherein the oxidation process partially consumes the memory region to recess the memory region; and removing the mask and oxide formed by the oxidation process. In some embodiments, the method further includes: forming a mask covering the logic region and a neighboring portion of the isolation structure; and performing a third etch into the isolation structure with the mask in place to define a memory sidewall, wherein the memory sidewall is slanted downward towards the memory region. In some embodiments, the method further includes: forming a pad layer covering the memory region, the logic region, and the isolation structure; performing a planarization into the pad layer until the isolation structure is exposed; removing the pad layer from the memory region, but not the logic region; and after the forming of the memory cell structure, removing the pad layer from the logic region, wherein the memory cell structure is formed between the removing of the pad layer from the memory region and the removing of the pad layer from the logic region.

In some embodiments, the present application provides an IC including: a substrate including a logic region and a memory region; a memory cell on the memory region; a logic device on the logic region; an isolation structure recessed into a top surface of the substrate and including a dielectric, wherein the isolation structure separates the memory region and the logic region, and wherein the isolation structure has a memory sidewall facing the memory cell and slanting downward towards the memory cell; and a dummy structure on the isolation structure, wherein the dummy structure borders the memory sidewall, and wherein the dummy structure and the isolation structure define a logic sidewall facing the logic device and slanting downward towards the logic device. In some embodiments, the memory cell includes a gate electrode and a ferroelectric data storage element underlying the gate electrode. In some embodiments, the logic sidewall is rounded at a bottom of the logic sidewall. In some embodiments, the dummy structure overlies a hillock of the isolation structure, and wherein the hillock is between the memory and logic sidewalls. In some embodiments, the memory sidewall is slanted at a shallower angle than the logic sidewall. In some embodiments, the memory region is recessed relative to the logic region by a difference between a height of the memory cell and a height of the logic device. In some embodiments, the IC further includes a second dummy structure overlying the isolation structure, laterally between the dummy structure and the logic device, wherein the second dummy structure has a top surface about even with a top surface of the dummy structure. In some embodiments, the logic device includes a high κ dielectric layer and a metal gate electrode overlying the high κ dielectric layer, and wherein the dummy logic structure includes an upper polysilicon layer and a lower high κ dielectric layer. In some embodiments, the dummy structure includes a lower oxide layer and an upper polysilicon layer overlying the lower oxide layer, and wherein the lower oxide layer and the upper polysilicon layer both define logic sidewall.

In some embodiments, the present application provides another method for forming an IC, the method including: recessing a memory region of a substrate relative to a logic region of the substrate; forming an isolation structure separating the memory region from the logic region; performing a first etch into the isolation structure to form a memory sidewall facing the memory region and slanting downward toward the memory region; forming a memory cell structure on the memory region; forming a capping layer covering the memory cell structure, the logic region, and the isolation structure; performing a second etch into the capping layer to remove the capping layer from the logic region, wherein the second etch forms a logic sidewall, and wherein the logic sidewall is slanted downward towards the logic region; forming a logic device structure on the logic region with the capping layer in place; and performing a third etch into the capping layer to remove the capping layer from the memory region and the memory sidewall, while leaving a dummy segment of the capping layer on the isolation structure, wherein the dummy segment defines the logic sidewall. In some embodiments, the method further includes forming a multilayer film on the logic region, wherein the multilayer film partially covers the isolation structure and is spaced from the memory sidewall, wherein the capping layer is formed covering the multilayer film, and wherein the second etch removes the multilayer film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC), the method comprising:
   forming an isolation structure separating a memory region of a substrate from a logic region of the substrate;
   forming a first mask covering the logic region and a first portion of the isolation structure that neighbors the logic region;
   performing a first etch into the isolation structure with the first mask in place to define a memory sidewall, wherein the memory sidewall is slanted downward towards the memory region;
   forming a multilayer film covering the memory region, the logic region, and the isolation structure;
   performing a second etch into the multilayer film to form a memory cell structure on the memory region and to remove the multilayer film from a second portion of the isolation structure;
   forming a capping layer covering the memory cell structure, a remainder of the multilayer film on the logic region, and the isolation structure;
   performing a third etch into the capping layer to remove the capping layer from the logic region, wherein the third etch forms a logic sidewall on the second portion of the isolation structure, and wherein the logic sidewall is slanted downward towards the logic region; and
   forming a logic device structure on the logic region with the capping layer in place.

2. The method according to claim 1, further comprising:
   performing a fourth etch into the capping layer to remove the capping layer from the memory region, while leaving a dummy segment of the capping layer on the second portion of the isolation structure, wherein the dummy segment defines the logic sidewall.

3. The method according to claim 1, wherein the forming of the logic device structure comprises:
   forming a high κ dielectric layer covering the capping layer and the logic region, and further lining the logic sidewall;
   forming a dummy gate layer covering and lining the high κ dielectric layer; and
   performing a fourth etch into the high κ dielectric layer and the dummy gate layer to form a dummy gate and a high κ gate dielectric layer stacked on the logic region, wherein the fourth etch removes the high κ dielectric layer from the logic sidewall.

4. The method according to claim 3, further comprising:
   replacing the dummy gate with a metal gate electrode.

5. The method according to claim 3, wherein the fourth etch further defines a dummy logic structure on the isolation structure, laterally spaced between the logic sidewall and the logic device structure.

6. The method according to claim 1, further comprising:
   recessing the memory region relative to the logic region, wherein the isolation structure is formed after the recessing.

7. The method according to claim 6, wherein the recessing comprises:
   forming a second mask covering the logic region, but not the memory region;
   performing an oxidation process to oxidize the memory region with the second mask in place, wherein the oxidation process partially consumes the memory region to recess the memory region; and
   removing the second mask and oxide formed by the oxidation process.

8. The method according to claim 6, further comprising:
   forming a pad layer covering the memory region, the logic region, and a boundary region;
   performing a planarization into the pad layer until the isolation structure is exposed;
   removing the pad layer from the memory region, but not the logic region; and
   after the forming of the memory cell structure, removing the pad layer from the logic region, wherein the memory cell structure is formed between the removing of the pad layer from the memory region and the removing of the pad layer from the logic region.

9. The method according to claim 1, wherein the isolation structure has a topmost surface that is substantially parallel to a top surface of the substrate, and wherein the topmost surface extends laterally from a top edge of the memory sidewall to the logic sidewall.

10. A method for forming an integrated circuit (IC), the method comprising:

recessing a memory region of a substrate relative to a logic region of the substrate;
forming an isolation structure separating the memory region from the logic region;
performing a first etch into the isolation structure to form a memory sidewall facing the memory region and slanting downward toward the memory region;
forming a memory cell structure on the memory region;
forming a capping layer covering the memory cell structure, the logic region, and the isolation structure;
performing a second etch into the capping layer to remove the capping layer from the logic region, wherein the second etch forms a logic sidewall from the capping layer, and wherein the logic sidewall is slanted downward towards the logic region;
recessing a first top surface portion of the isolation structure relative to a second top surface portion of the isolation structure, wherein the recessing of the first top surface portion extends the logic sidewall downward from the second top surface portion to the first top surface portion, and wherein the second top surface portion extends from the memory sidewall to the logic sidewall;
forming a logic device structure on the logic region while the capping layer covers the memory region and after the recessing of the first top surface portion; and
performing a third etch into the capping layer to remove the capping layer from the memory region and the memory sidewall, while leaving a dummy segment of the capping layer on the second top surface portion of the isolation structure, wherein the dummy segment and the isolation structure at least partially define the logic sidewall.

11. The method according to claim 10, further comprising:
forming a multilayer film on the logic region, wherein the multilayer film partially covers the isolation structure and is spaced from the memory sidewall, wherein the capping layer is formed covering the multilayer film, and wherein the second etch removes the multilayer film.

12. The method according to claim 10, wherein the recessing of the memory region comprises:
forming a pad layer covering the logic region, but not the memory region;
oxidizing the memory region while the pad layer covers the logic region, wherein the pad layer prevents oxidation of the logic region during the oxidizing, and wherein the oxidizing forms a sacrificial oxide layer covering the memory region; and
removing the sacrificial oxide layer and the pad layer.

13. The method according to claim 10, further comprising:
depositing a pad layer covering the memory and logic regions, wherein the pad layer is deposited after the recessing of the memory region;
patterning the pad layer and the substrate to form a trench separating the memory and logic regions from each other;
depositing a dielectric layer filling the trench and covering the pad layer; and
performing a planarization into the dielectric layer and the pad layer until a top surface of the dielectric layer is even with top surface segments of the pad layer respectively at the memory and logic regions.

14. The method according to claim 10, further comprising:
forming a pad layer covering the memory and logic regions and having a top surface even with that of the isolation structure, wherein a thickness of the pad layer is greater at the memory region than at the logic region; and
forming a mask covering the pad layer at the logic region, but not at the memory region, and further covering a portion of the isolation structure, wherein the first etch is performed with the mask in place and forms the memory sidewall slanting downward to a location below a top surface of the pad layer.

15. The method according to claim 10, wherein the second top surface portion is elevated above a topmost surface of the substrate.

16. A method for forming an integrated circuit (IC), the method comprising:
forming an isolation structure separating a memory region of a substrate from a logic region of the substrate;
forming a memory cell structure on the memory region;
forming a capping layer covering the memory cell structure, the isolation structure, and the logic region, wherein the forming of the capping layer comprises depositing the capping layer and performing a planarization into the capping layer to flatten a top surface of the capping layer, wherein the top surface slants downward from the logic region to the memory region upon completion of the planarization;
patterning the capping layer to remove the capping layer from the logic region, but not the memory region, and to further form a logic sidewall facing the logic region and slanting downward towards the logic region;
forming a multilayer film overlying the capping layer and covering the memory region, the logic region, and the isolation structure;
performing a first etch into the multilayer film to concurrently form a device structure and a dummy structure respectively on the logic region and the isolation structure; and
removing the capping layer from the memory region.

17. The method according to claim 16, wherein the patterning of the capping layer comprises:
forming a mask covering the capping layer and the memory region, wherein the mask has a sidewall overlying the isolation structure; and
performing a second etch into the capping layer with the mask in place, wherein the sidewall of the mask is laterally spaced from and laterally between a top edge of the logic sidewall and a bottom edge of the logic sidewall upon completion of the second etch.

18. The method according to claim 16, wherein the capping layer has a triangular profile upon removing the capping layer from the memory region.

19. The method according to claim 16, wherein the multilayer film comprises a conductive layer and a mask layer overlying the conductive layer, and wherein the method further comprises:
performing a second etch into the multilayer film before the first etch, wherein the second etch fully removes the mask layer from the memory region and partially removes the conductive layer from the memory region, and wherein the conductive layer has different thicknesses respectively at the memory and logic regions upon completion of the second etch.

20. The method according to claim 19, wherein the conductive layer transitions between the different thicknesses at a location overlying the isolation structure.

* * * * *